(12) United States Patent
Mino et al.

(10) Patent No.: US 7,579,086 B2
(45) Date of Patent: Aug. 25, 2009

(54) SUBSTRATE FOR USE IN CRYSTALLIZATION AND METHOD FOR PRODUCING THE SAME

(75) Inventors: Norihisa Mino, Osaka (JP); Yuusuke Takada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 382 days.

(21) Appl. No.: 11/020,063

(22) Filed: Dec. 23, 2004

(65) Prior Publication Data

US 2005/0158208 A1 Jul. 21, 2005

(30) Foreign Application Priority Data

Dec. 24, 2003 (JP) ............................. 2003-427888

(51) Int. Cl.
*B32B 9/04* (2006.01)
(52) U.S. Cl. ...................................... 428/447; 427/387
(58) Field of Classification Search ................. 428/447; 427/387
See application file for complete search history.

(56) References Cited

U.S. PATENT DOCUMENTS

| | | | | |
|---|---|---|---|---|
| 5,260,115 A | * | 11/1993 | Mino et al. ................. | 428/167 |
| 5,270,080 A | | 12/1993 | Mino et al. | |
| 5,284,707 A | | 2/1994 | Ogawa et al. | |
| 5,324,566 A | * | 6/1994 | Ogawa et al. ............... | 428/141 |

(Continued)

FOREIGN PATENT DOCUMENTS

| EP | 0 909 841 | 4/1999 |
|---|---|---|
| JP | 2004-132637 | 5/1992 |
| JP | 04-359031 | 12/1992 |
| JP | 10-180179 | 7/1998 |
| JP | 2003-286100 | 10/2003 |

(Continued)

OTHER PUBLICATIONS

"The Biochemical Experiment 1, Protein chemistry 1, Separation and Purification", Published by Tokyo Kagaku Dojin Co., Ltd., 1st Edition Published on Mar. 22, 1976, 7th Edition Published on Jul. 11, 1984, pp. 82-87.

(Continued)

*Primary Examiner*—Margaret G Moore
(74) *Attorney, Agent, or Firm*—Wenderoth, Lind & Ponack, LLP.

(57) ABSTRACT

A substrate for use in crystallization has a base member, and an organic molecular film on a surface of the base member. The organic molecular film has non-affinity to a liquid, and the surface of the base member and the organic molecular film are covalently bound to each other. The substrate formed with the organic molecular film having non-affinity to the liquid on the surface of the base member is produced by contacting the surface of the base member having an active hydrogen atom or the surface of the base member to which the active hydrogen atom is introduced, with an organic molecule including a terminal-bonding functional group capable of covalently bonding to the surface of the base member at one end thereof, and a functional group showing non-affinity to the liquid at the other end thereof so as to covalently bond the terminal-bonding functional group of the organic molecule to the active hydrogen atom on the surface of the base member by reaction of the terminal-bonding functional group with the active hydrogen atom. The substrate enables to efficiently crystallize polymeric compounds including biomolecules such as proteins, nucleic acids, and sugars; and resins, as well as other organic compounds, and inorganic compounds.

20 Claims, 13 Drawing Sheets

U.S. PATENT DOCUMENTS

| | | |
|---|---|---|
| 5,380,585 A | 1/1995 | Ogawa et al. |
| 5,407,709 A | 4/1995 | Ogawa et al. |
| 5,437,894 A | 8/1995 | Ogawa et al. |
| 5,466,486 A | 11/1995 | Ogawa et al. |
| 5,580,605 A | 12/1996 | Ogawa et al. |
| 5,948,476 A | 9/1999 | Otake et al. |
| 6,183,558 B1 | 2/2001 | Otake et al. |
| 6,352,758 B1 * | 3/2002 | Huang et al. ................ 428/143 |
| 6,376,576 B2 * | 4/2002 | Kang et al. ................ 523/202 |
| 6,503,567 B2 | 1/2003 | Ogawa et al. |
| 6,521,334 B1 | 2/2003 | Ogawa et al. |
| 2002/0039628 A1 * | 4/2002 | Ogawa ...................... 428/1.2 |
| 2002/0094375 A1 | 7/2002 | Ogawa et al. |
| 2002/0127331 A1 | 9/2002 | Ogawa et al. |
| 2002/0127499 A1 * | 9/2002 | Endo et al. ................ 430/327 |

OTHER PUBLICATIONS

"The Fourth Series of Experimental Chemistry 2, Basic operation II", Published by Maruzen Co., Ltd., Dec. 5, 1990, pp. 354-358.

"Dynamics on Crystal Growth, crystal growth from a solution", published by Kyoritsu Syuppan Co., Ltd., Sep. 1, 2002, pp. 67-69.

Jiyu Fang et al., Phase-Separated Two-Component Self-Assembled Organosilane Monolayers and Their Use in Selective Adsorption of a Protein, Langmuir, 1996, vol. 12, pp. 1368-1374.

James M. Van Alstine et al., Polymer coatings for improved protein crystal growth, Colloids and Surfaces B. Biointerfaces No. 1-4, 14, 1999, pp. 197-211.

Jeonggi Seo et al., Self-Assembly Templates By Selective Plasma Surface Modification of Micropatterned Photoresist, Proceedings of the IEEE 15th Annual International Conference on Micro Electro Mechanical Systems MEMS 2002, Las Vegas, NV, vol. CONF. 15, pp. 192-195.

Lu et al., "*Northwestern Light Industry Institute Journal*", vol. 20, No. 4, pp. 45-48 (2002).

* cited by examiner

< 3 min >

< 10 min >

US 7,579,086 B2

SUBSTRATE FOR USE IN CRYSTALLIZATION AND METHOD FOR PRODUCING THE SAME

BACKGROUND OF THE INVENTION

1. Field of the Invention

The present invention relates to a substrate for use in crystallizing polymeric compounds including biomolecules such as proteins, nucleic acids, and sugars; and resins, as well as other organic compounds and inorganic compounds, and to a method for producing the substrate.

2. Description of the Related Art

Three-dimensional structural analysis on organic polymers has been significantly important in order to elucidate the functions of these various organic polymers such as proteins. Particularly, in light of a fact that various diseases are induced by abnormality of proteins or the like, structural analysis on proteins which may induce various diseases has been carried out, and development of pharmaceuticals based on the analysis has been progressed in pharmaceutical fields. For instance, generally, structural analysis on proteins is performed by crystallizing purified protein solutions and subjecting the purified proteins to X-ray crystallographic analysis, NMR analysis, or a like analysis (see "The biochemical Experiment 1, Protein chemistry 1, Separation and Purification" edited by the Japanese Biochemical society, First Edition, vol. 1, published by Tokyo kagaku dozin Co., Ltd., published on Jul. 11, 1984, pp. 82-87; and "The Fourth Series of Experimental Chemistry 2, basic operation II" edited by the Chemical Society of Japan, Vol. 2, published by Maruzen Co., Ltd., published on Dec. 5, 1990, pp. 354-358). However, it is extremely difficult to set conditions for crystallization of proteins that enable to form single crystals while suppressing generation of micro crystals.

Particularly, as a contact area of a solution (liquid phase) containing a target protein with an interior of a crystallization apparatus (solid phase) is increased, crystal nuclei are likely to be generated on contact sites. As a result, it is highly likely that crystal polymorphs and micro crystals are generated, which makes it difficult to obtain crystals suitable for structural analysis.

To solve the above drawback, in recent years, crystallization in a microgravity space has been actually carried out in a space shuttle ("Dynamics on Crystal Growth, crystal growth from a solution", by Kiyotaka SATOH, First Edition, Vol. 6, Kyoritsu Shuppan Co., Ltd, published on Sep. 1, 2002, pp. 67-69). However, crystallization in a microgravity space costs high, including installation cost, and accordingly, it is conceived that practice of crystallization in a microgravity space is extremely difficult.

As another measure for solving the drawback, Japanese Unexamined Patent Publication No. 2003-286100 proposes a technique of crystallizing proteins. The publication discloses that droplets of a protein solution to be crystallized are dropped on a substrate with use of a droplet ejector to form hemispherical microdots on the substrate, and that the hemispherical microdots are dried in a predetermined atmosphere for crystallizing the protein.

In the above method, since each of the droplets has a hemispherical shape, a contact area of the droplet with a substrate surface is relatively large. Accordingly, it is highly likely that crystal nuclei are generated on contact sites, with the result that crystal polymorphs or micro crystals are likely to be generated. Further, since drying progresses in a phase boundary between the hemispherical portion and a gas phase, isotropic drying of the droplets is hindered, which may likely to generate crystal polymorphs.

SUMMARY OF THE INVENTION

In view of the problems residing in the prior art, it is an object of the present invention to provide a substrate for use in crystallization that enables to stably and efficiently crystallize polymeric compounds including biomolecules such as proteins, nucleic acids, and sugars; and resins, as well as other organic compounds and inorganic compounds, as compared with the conventional art, and a method for producing the substrate.

According to an aspect of the present invention, a substrate for use in crystallization comprises a base member, and an organic molecular film on a surface of the base member. The organic molecular film has non-affinity to a liquid, and the surface of the base member and the organic molecular film are covalently bound to each other.

According to another aspect of the present invention, a method for producing a substrate formed with an organic molecular film having non-affinity to a liquid to be crystallized on a surface of a base member comprises a step of: contacting the surface of the base member having an active hydrogen atom or the surface of the base member to which the active hydrogen atom is introduced, with an organic molecule having a terminal-bonding functional group capable of covalently bonding to the surface of the base member at one end thereof, and a functional group showing non-affinity to the liquid at the other end thereof, forming a bond between the terminal-bonding functional group of the organic molecule and the active hydrogen atom on the surface of the base member by reaction of the terminal-bonding functional group with the active hydrogen atom.

These and other objects, features and advantages of the present invention will become more apparent upon reading of the following detailed description along with the accompanying drawings.

DETAILED DESCRIPTION OF THE PREFERRED EMBODIMENTS OF THE INVENTION

Figure 1:
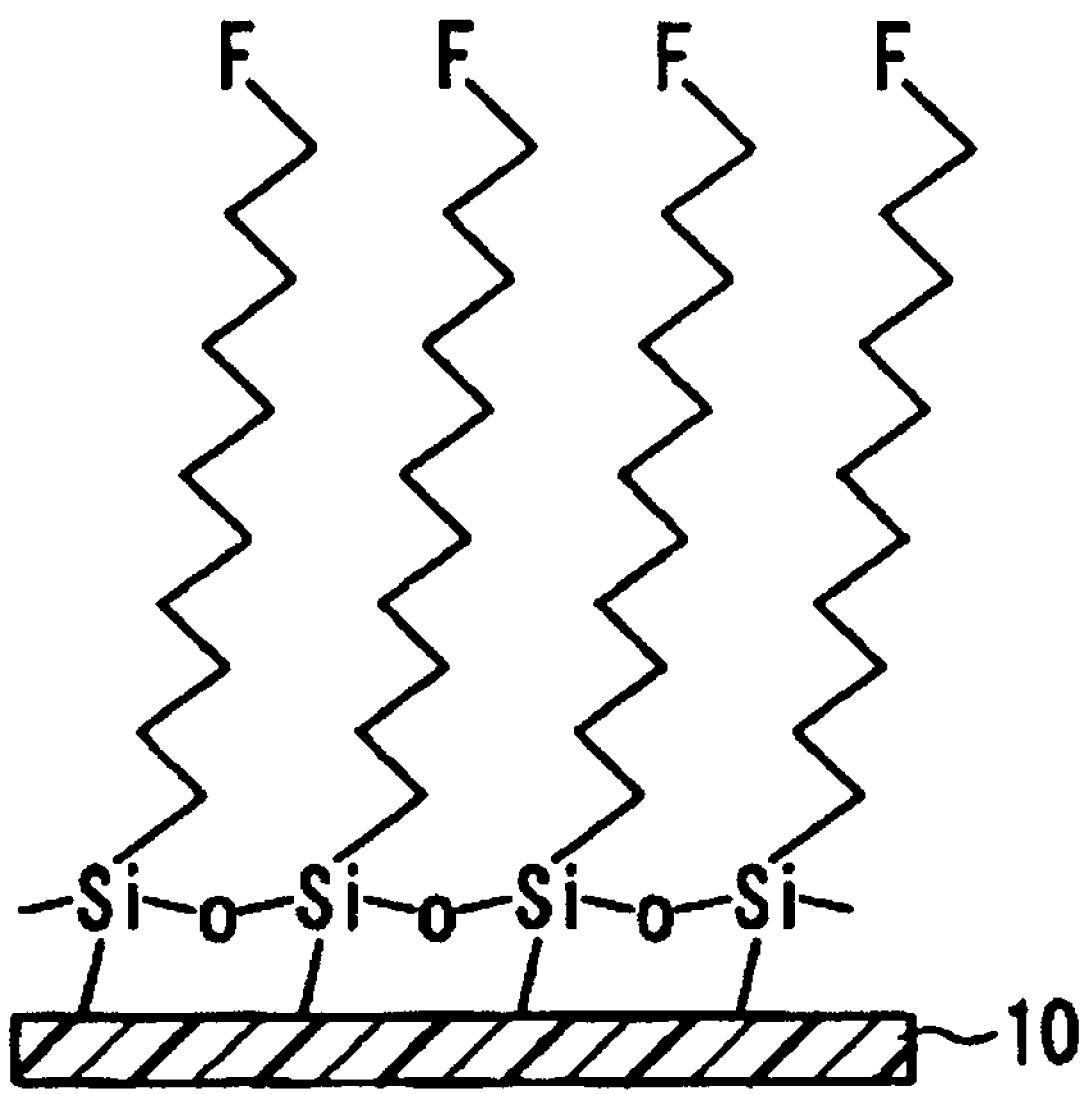
FIG. 1 is an illustration schematically showing how an organic molecular film is bound to a base member of a substrate for use in crystallization according to the present invention.

In the following, preferred embodiments of the present invention are described in detail.

A substrate for use in crystallization according to an embodiment of the present invention has a site for crystallization on a surface thereof, and comprises a base member, and an organic molecular film on a surface of the base member, wherein the organic molecular film has non-affinity to a liquid, and the surface of the base member and the organic molecular film are covalently bound to each other. Single crystals can be efficiently generated by dropping a solution (liquid to be crystallized) containing a material to be crystallized onto the substrate, and by allowing the liquid to transpire substantially isotropically under appropriate conditions.

The material to be crystallized is not specifically limited, as far as crystals are obtainable from the liquid. Specifically, the material to be crystallized comprises: polymeric compounds such as proteins, sugars, lipids, nucleic acids, and resins; organic compounds; and various inorganic compounds. The organic compounds include: organic materials that exhibit non-linear optical effects, such as nitroaniline derivatives, and stilbazolium tosylate derivatives; organic materials that exhibit photo and electrically conductive functions, such as polycyclic hydrocarbons including anthracene, pentacene, and naphthacene, and its derivatives thereof; and various amino acids. Although it is generally difficult to obtain single crystals from polymeric compounds such as proteins, the inventive substrate is advantageous in efficiently obtaining single crystals at a low cost, as compared with the conventional method.

The size and other parameters of the inventive substrate are not specifically limited. In other words, it is possible to use the inventive substrate to a site where the liquid to be crystallized is contacted in crystallizing the material to be crystallized with use of various well-known crystallization apparatus or jigs. Accordingly, the size of the inventive substrate is not specifically limited, and can be determined optionally depending on the size of the crystallization apparatus or the like.

In the embodiment of the present invention, the organic molecular film is a film made of organic molecules showing partly non-affinity to a liquid. Hereinafter, such an organic molecule is simply called as "organic molecule". The organic molecular film is at least partially covalently bound to a base member.

Specific examples of the organic molecular film include a film (hereinafter, simply called as "mono-molecular film") obtained by covalent bonding of organic molecules to a base member in a mono-layered manner, a film (hereinafter, simply called as "layered-molecular film") constructed such that plural organic molecules are covalently bound to each other one in a multi-layered manner, and a film (hereinafter, simply called as "adjoining-molecule-bonding film") constructed such that terminal functional groups of adjoining organic molecules are covalently bound to each other, and the terminal functional groups are at least partially covalently bound to a base member.

The mono-molecular film is an organic molecular film in which organic molecules are covalently bound to the surface of a base member in a mono-layered manner. The thickness of the mono-molecular film ranges preferably, from 0.5 to 2 nm, and more preferably, from 1 to 2 nm.

The layered-molecular film is an organic molecular film in which a functional group at a terminal of each organic molecule which is covalently bound to a base member is covalently bound to another organic molecule in a multi-layered manner. The thickness of the layered-molecular film ranges preferably from 1 to 50 nm, more preferably from 1 to 10 nm, and particularly preferably from 1 to 6 nm. The number of the layered organic molecules ranges preferably from 2 to 100, more preferably from 2 to 50, and particularly preferably from 2 to 6.

Figure 11:
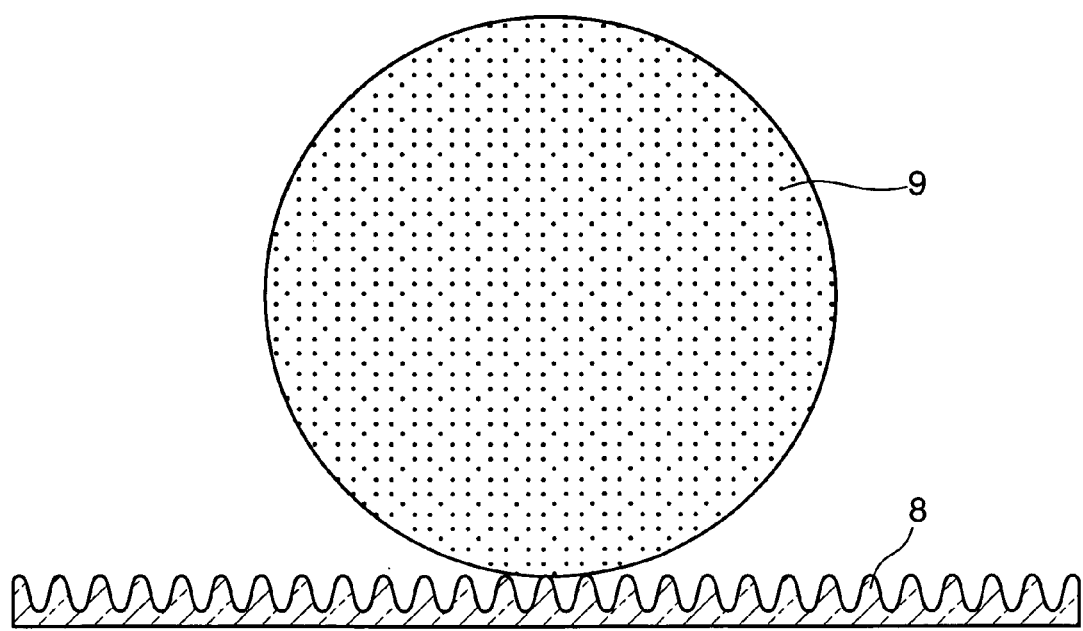
FIG. 11 is an illustration showing a water droplet of a substantially spherical shape on the substrate according to the present invention.

The adjoining-molecule-bonding film is an organic molecular film in which terminal-bonding functional groups of organic molecules are at least partially covalently bound to a base member, and the adjoining organic molecules are covalently bound to each other. The thickness of the adjoining-molecule-bonding film ranges preferably from 1 to 200 nm, and particularly preferably 5 to 100 nm. Preferably, the surface of the inventive substrate formed with the organic molecular film showing non-affinity to the liquid has asperities (micro protrusions and recesses). Forming the asperities on the surface of the substrate is advantageous in making the liquid to be crystallized a true sphere or a shape analogous to a true sphere (hereinafter, sometimes called as "substantially spherical shape"), as shown in FIG. 11, in dropping a liquid droplet onto the substrate by a synergic effect of non-affinity of the organic molecular film to the liquid, and the asperities formed on the substrate surface. The reference numeral 8 denotes a substrate, and 9 denotes a droplet of a liquid to be crystallized in FIG. 11. As a result of the synergic effect, the contact area of the liquid to be crystallized with the substrate surface can be minimized, and the solvent in the liquid can be vaporized uniformly from the surface of the droplet. Further, minimization of the contact area enables to suppress a difference in concentration of the liquid to be crystallized in droplets, which contributes to stable crystallization.

The asperities formed on the surface of the substrate means a state of a surface having a certain height (hereinafter, called as "the height of the protrusion") from the bottom surface of a recess to the top surface of a protrusion of the asperities. The height of the protrusion ranges preferably from 0.005 to 5000 µm, more preferably from 0.02 to 0.5 µm, and particularly preferably from 0.03 to 0.2 µm. If the height of the protrusion is lower than 0.005 µm, it is difficult to maintain a substantially spherical shape. On the other hand, if the height of the protrusion is higher than 0.5 µm, light transmission of the substrate is lowered despite formation of a liquid droplet of a substantially spherical shape, which may obstruct microscopic observation to confirm crystal growth (particularly, observation by transmissive light). The height of the protrusion can be calculated based on an image obtained through a scanning electron microscope (SEM), for instance.

The substrate surface formed with asperities have a surface roughness ranging preferably from 0.003 to 500 µm, more preferably from 0.003 to 100 µm, furthermore preferably from 0.01 to 1 µm, and particularly preferably from 0.02 to 0.1 µm. It is difficult to manufacture a substrate having a surface roughness smaller than 0.003 µm according to the current technology. On the other hand, if the surface roughness exceeds 500 µm, it is difficult to maintain a substantially spherical shape of a liquid droplet in dropping a liquid droplet of about several mm in size. The surface roughness can be measured by, for example, a surface roughness meter. A scanning probe microscope (SPM) may be used, for instance, to measure the surface roughness of a particularly fine structure.

A contact angle of a liquid droplet relative to the substrate surface, and a contact area of the droplet with the substrate surface can be controlled by changing the area ratio of protrusions to recesses of asperities. Such area ratio control can be performed by, for example, a semiconductor lithography.

Figure 10:
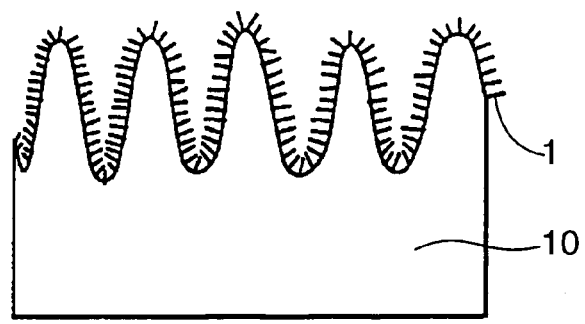
FIG. 10 is an illustration showing a substrate formed with an organic molecular film having asperities.

The asperities can be formed on a surface of a substrate by using a base member whose surface has asperities, or by depositing metal oxide particles on a surface of a base member. In the case where the base member having asperities on the surface thereof is used, the organic molecular film can be formed on the surface of the base member without impairing the asperities of the base member, as shown in FIG. 10, because the organic molecular film is a very thin film. The reference numeral 1 denotes an organic molecular film, and 10 denotes a base member having asperities on the surface in FIG. 10. Asperities on the surface of the base member can be formed by subjecting the surface of the base member to surface treatment for forming the asperities. The method of surface treatment is not specifically limited. Various well-known methods such as etching, sand blast, plasma treatment, and reactive sputter etching using an oxygen gas can be used. It is possible to produce a base member having asperities by plastic molding with use of an extruder.

Figure 9A:
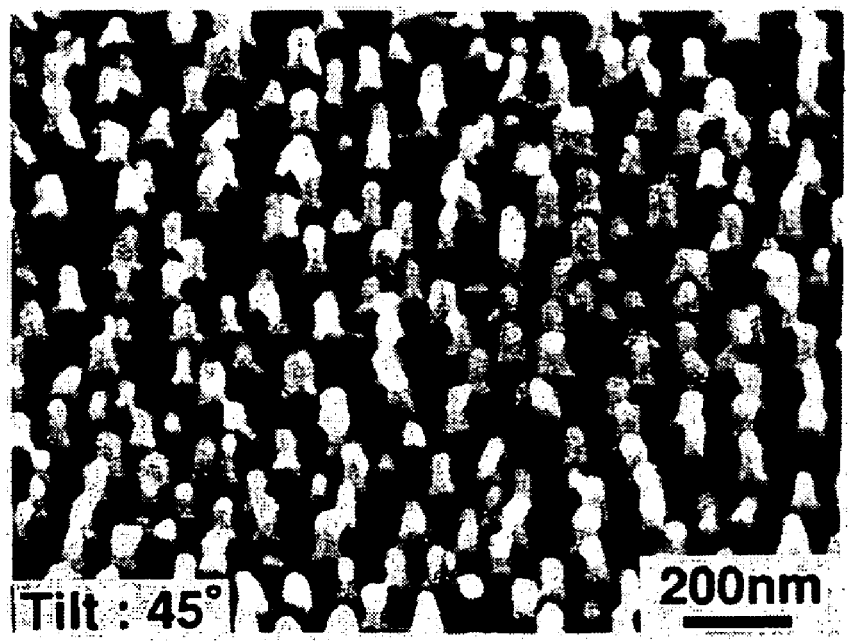
FIGS. 9A and 9B are SEM photos respectively showing a surface of a base member formed with asperities, and a surface of a substrate comprising the base member in FIG. 9A and a mono-molecular film formed on the surface of the base member.
Figure 9B:
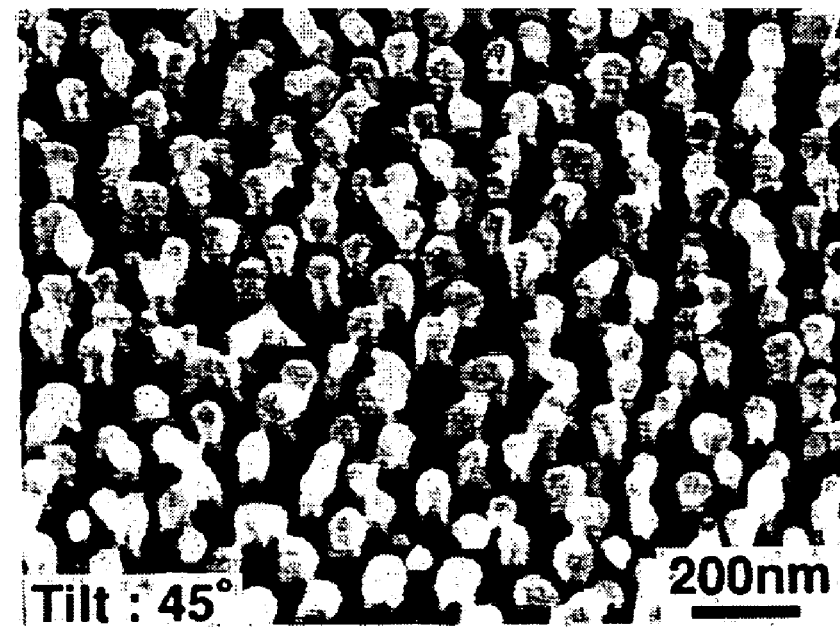

Examples of the substrate having asperities are as shown in FIGS. 9A and 9B. FIG. 9A is an SEM photo showing a surface of a base member, wherein asperities are formed by etching, and FIG. 9B is an SEM photo showing a surface of a substrate comprising the base member shown in FIG. 9A, and a mono-molecular film formed on the surface of the base member. As is obvious from FIG. 9B, the asperities formed on the surface of the base member are retained even if the mono-molecular film is formed on the surface of the base member. The base member is a silicon semiconductor wafer (produced by Shin-Etsu Chemical Co., Ltd.), wherein a silicon oxide film of 600 nm in thickness is deposited with use of tetra-ethoxysilane (TEOS). The etching was carried out under an atmosphere of an oxygen gas of about 10 Pa in pressure for 240 seconds. The surface roughness of the base member was 50 nm, and the height of the protrusion was 0.12 µm. The mono-molecular film was formed with use of an organic molecule as represented by the chemical formula: $CF_3(CF_2)_7(CH_2)_2SiCl_3$. The thickness of the mono-molecular film was about 1.5 nm.

Asperities on a surface of a base member can be formed by depositing metal oxide particles or the like on the surface of the base member.

Examples of the metal oxide particles or the like (hereinafter, also called as "particles") are metal oxide particles including titanium oxides, alumina, and silicon oxides such as silica; silicon powders, glass powders; and particles of natural minerals such as talc and mica. Among these, the metal oxide particles are preferred in the point that particles of a desired diameter are obtainable.

It is preferred to set the average particle diameter of the particles in the range from about 0.005 to 100 µm, and more preferably, from about 0.007 to 50 µm to form asperities of a size suitable for exhibiting the effects of the present invention.

The amount of the particles to be deposited on the surface of the base member is not specifically limited, as far as asperities as defined above can be formed. It is, however, preferred to set the concentration of the particles in a solution in the range from about 1 to 30% by mass in the case where the solution with the particles being dispersed therein is applied to the surface of the base member to deposit the particles on the surface of the base member.

The method for depositing the particles on the surface of the base member is not specifically limited. The particles may be deposited on the surface of the base member by, for instance, sprinkling the particles in a dry state onto the base member, or by dispersing the particles in a solution and applying the solution containing the dispersed particles onto the base member. Dispersing the particles in a solution containing organic molecules for forming an organic molecular film and applying the solution containing the organic molecules onto the surface of the base member is preferred to form an organic molecular film.

In the case of forming the inventive substrate by depositing particles on a surface of a base member, it is preferred to use the adjoining-molecule-bonding film to form an organic molecular film. Since the adjoining-molecule-bonding film has a feature that adjoining organic molecules are bound to each other in several molecules, it is advantageous in securely holding the particles on the base member. Specifically, since the adjoining-molecule-bonding film has the features that the adjoining organic molecules are covalently bound to each other, and the terminal-bonding functional groups of the organic molecules are at least partially covalently bound to the base member and the particles, the film is advantageous in keeping the particles from being dissociated from the base member. In view of the above, it is desirable to hold, on the surfaces of the particles, active hydrogen atoms each capable of forming a covalent bond to a terminal-bonding functional group of each organic molecule, which will be described later.

It is not necessary for the particles to be held on the base member merely by chemical bonding. The particles may be held on the base member merely by physical adsorbing force. Specifically, as far as asperities are formable on the surface of the base member in crystallization in a state that the particles are held on the surface of the base member, the holding manner of particles is not limited. However, it is preferable that the particles on the base member are covered by the organic molecular film and that the particles are held on the base member by covalent bonds of the organic molecules.

In the case where there is likelihood that particles may be intruded in the liquid to be crystallized due to weak adsorbing force of the particles to the substrate surface, it is possible to remove such particles from the substrate surface by preliminary washing. Spraying or showering a liquid onto the substrate surface is an exemplified method of preliminary washing.

A liquid droplet of a substantially spherical shape can be formed on the substrate surface with a large contact angle relative to the substrate surface in dropping the droplet onto the substrate surface, if the substrate surface has asperities, and the surface of the base member is covered with an organic molecular film showing non-affinity to the liquid. Thus, the contact area of the droplet with the substrate surface can be minimized, and crystallization of organic materials including polymers, and various inorganic materials can be carried out in a stable manner.

The contact angle is preferably not less than 120 degrees but less than 180 degrees, more preferably not less than 150 degrees but less than 180 degrees, and particularly preferably not less than 160 degrees but less than 180 degrees. In the case where the liquid to be crystallized is an aqueous solution, as an example of the method for measuring the contact angle, water of 4 μl as a specimen is dropped on the surface of the substrate, and the contact angle of the water droplet is measured by a static contact angle meter (product name "contact angle meter" produced by Kyowa Interface Science Co., Ltd.). Alternatively, the contact angle may be measured with use of an enlarged photo of the water droplet.

Although it is impossible to straightforwardly define the volume of a liquid droplet to be dropped onto the substrate surface based on a target material to be crystallized or a property of the substrate. Preferably, the volume of the liquid droplet is from 0.1 μl to 50 ml, and more preferably from 2 μl to 15 ml.

Figure 8:
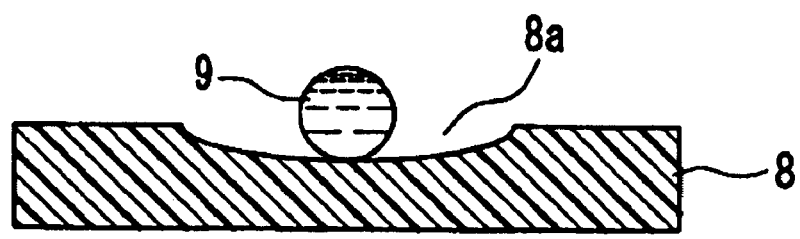
FIG. 8 is an illustration showing a substrate formed with an indented portion for preventing rolling of a water droplet.

The substrate according to the embodiment of the present invention may have an indented portion for keeping a liquid droplet from rolling, as shown in FIG. 8. FIG. 8 is a cross-sectional view showing an example of the inventive substrate, wherein the reference numeral 8 denotes a substrate, 8a denotes an indented portion, and 9 denotes a droplet of a liquid to be crystallized. The indented portion 8a formed in the substrate 8 enables to keep the droplet 9 from moving or rolling on the substrate surface in crystallizing the material to be crystallized.

Further, in the case where a plurality of indented portions are formed in the substrate, the substrate serves as a sorting device in a so-called combinatorial chemistry of efficiently selecting an optimal condition for crystallization depending on the kind of the material to be crystallized, in place of setting conditions individually with respect to each of the materials to be crystallized in the indented portions.

The shape of the rolling-preventive indented portion is not specifically limited, and various shapes in cross section such as hemi-circle, four-sided configuration such as square, rectangle, and trapezoid, and other polygonal shapes can be selected depending on the purpose of use, in addition to the shape as shown in FIG. 8. It is preferred that the entirety of the wall surface of the indented portion is covered with an organic molecular film, in the case where the indented portion has a four-sided configuration in cross section. The depth of the indented portion preferably ranges from 0.01 to 20 mm, and more preferably from 0.1 to 5 mm. The area of the indented portion in top plan view preferably ranges from 0.05 to 200 mm$^2$, and more preferably from to 0.01 to 10 mm$^2$.

Further, the number of the indented portions may be plural. Formation of the plurality of the indented portions is useful in combinatorial chemistry.

An exemplified method for producing the substrate having the rolling-preventive indented portion is described in the following.

Specifically, asperities can be formed on the surface of an indented portion by: forming an indented portion in a base member; forming asperities on the base member by etching or a like treatment; and forming a organic molecular film on the base member.

In the embodiment of the present invention, each of the organic molecules constituting the organic molecular film has at one end thereof a functional group (hereinafter, sometimes called as "a terminal-bonding functional group") capable of forming a covalent bond on the surface of the base member, and at the other end thereof a functional group (hereinafter, sometimes called as "a property functional group") showing non-affinity to the liquid. Specifically, the covalent bond is formed by reaction of the terminal-bonding functional group with an active hydrogen atom on the base member. Further, the property that the organic molecular film shows non-affinity to the liquid can be imparted by the property functional group.

"The non-affinity to the liquid" can be optionally defined depending on the kind of the liquid. In the case where the liquid is aqueous, preferably, "the non-affinity to the liquid" is hydrophobic property.

The solvent component of the liquid to be crystallized in the embodiment of the present invention is not specifically limited. A liquid such as water, alcohols, and hydrocarbons, which can dissolve the material to be crystallized and is suitable for crystallization, is usable.

In the embodiment of the present invention, the organic molecular film is bound to the base member by strong covalent bonding. Accordingly, the organic molecular film is securely fixed to the base member, with formation of the fine film showing non-affinity to the liquid.

In case of using an organic molecular film such as a monomolecular film having no covalent bond, the organic molecular film is likely to be detached from the base member, which makes it difficult to form a fine organic molecular film on the base member.

In case of forming a mono-molecular film with use of a thiol compound that does not form a covalent bond to the base member, as an organic molecule, a fine film is less likely to be formed, thereby lowering film density. Accordingly, it is difficult to form a liquid droplet of a large contact angle relative to a substrate surface having such a low film density.

In case of using a thiol compound, generally, the thiol compound is coordinately bound to the base member.

Further, the following phenomenon is known. Specifically, in the case where the thiol compounds coordinately bound to the base member come close to each other, the sulfur atom that has been temporarily bound to the base member forms a chemical bond to the adjacent sulfur atom to thereby form a dithiol bond. As a result, the thiol compounds are dissociated from the base member.

Since the inventive substrate has a feature that the organic molecular film is at least partially covalently bound to the base member, the substrate exhibits superior hydrophobic performance, water repellency, or a like property.

The kind of the terminal-bonding functional group is not specifically limited, as far as the group is capable of forming a covalent bond to the surface of the base member, as mentioned above. Examples of the terminal-bonding functional group are silyl groups such as halogenated silyl group, alkoxysilyl group, and isocyanatesilyl group.

Examples of the halogenated silyl group are monohalogensilyl group, dihalogensilyl group, and trihalogensilyl group. Examples of the halogen are chloro, bromo, fluoro, and iode.

Among these, chlorosilyl group is preferred. Examples of the alkoxysilyl group are monoalkoxysilyl group, dialkoxysilyl group, and trialkoxysilyl group. It is preferable that the alkoxy group in the alkoxysilyl group has carbon atoms from 1 to 7, for instance, and more preferably from 1 to 3. Specific examples of the alkoxysilyl group are methoxysilyl group, ethoxysilyl group, and butoxysilyl group.

The organic molecule having one of these silyl groups at an end thereof is capable of forming a covalent bond on the surface of the base member. The organic molecular film is securely bound to the surface of the base member by the covalent bond. Thereby, the organic molecular film exhibits superior durability.

Specifically, if the organic molecule has a halogenated silyl group, dehydrohalogenation such as dehydrochlorination occurs by reaction with an active hydrogen atom on the surface of the base member. If the organic molecule has an alkoxysilyl group, dealcoholation occurs by reaction with the active hydrogen atom. If the organic molecule has an isocyanate silyl group, deisocyanation occurs by reaction with the active hydrogen atom.

As a result of the respective reactions, the organic molecule and the base member are covalently bound to each other by a siloxane bond (—Si—O—).

Further, a silanol group is formed at a terminal of the silyl group by hydrolysis. The silanol group of the organic molecule is capable of forming crosslinking by way of a siloxane bond, as shown in FIG. 1, by dehydration of silanol groups adjacent to each other. The reference numeral 10 denotes a base member in FIG. 1.

The organic molecules form a complex crosslinking structure by at-random formation of the crosslinking, whereby asperities are formed on an organic molecular film by the film itself.

The covalent bond of the organic molecule to the base member differs depending on the kind of the group having an active hydrogen atom on the surface of the base member. For instance, if the group having an active hydrogen atom is —NH group, —SiN-bond is formed as the covalent bond.

As far as the property functional group is a functional group capable of providing the organic molecular film with non-affinity to the liquid, the kind of the property functional group is not specifically limited. Examples of the property functional group are functional groups showing water repellency (e.g., hydrophobic property), or oil repellency (lipophobic property). Preferred examples of the property functional group are a hydrocarbon group, and a hydrocarbon group in which part or all of the hydrogen atoms are substituted by a fluorine atom. The hydrocarbon group may be a saturated hydrocarbon group or an unsaturated hydrocarbon group. Further, the hydrocarbon group may be in the form of a straight chain, a branched chain, or cyclic. Although the number of carbon atoms in the hydrocarbon group is not specifically limited, the number may be in the range preferably from 1 to 36, more preferably from 5 to 30, for example. Examples of the property functional group are CF3—, F(CF$_2$)$_t$—, CH$_3$—, and H(CH$_2$)$_t$—, where t is an integer preferably from 1 to 15, more preferably from 8 to 12. Among these, in the case where the liquid is an aqueous solvent, F(CF$_2$)$_t$— or H(CH$_2$)$_t$— is preferred, and in the case where the liquid is a lipid solvent, F(CF$_2$)$_t$— is preferred.

In the embodiment of the present invention, the kind of the organic molecule is not specifically limited. For instance, the organic molecules disclosed in Japanese Unexamined Patent Publication Nos. 4-132637, 4-256466, 10-180179, and 4-359031 are usable.

Among these organic molecules, organic molecules as represented by the following formulae (1) through (4) and derivatives thereof are preferred.

$$F(CF_2)_m(CH_2)_n SiR_q X_{3-q} \quad (1)$$

$$F(CF_2)_r(CH_2)_s A(CH_2)_p SiR_q X_{3-q} \quad (2)$$

$$H(CH_2)_m(CH_2)_n SiR_q X_{3-q} \quad (3)$$

$$H(CH_2)_r(CH_2)_s A(CH_2)_p SiR_q X_{3-q} \quad (4)$$

In the formulae (1) and (3), preferably, m is an integer from 1 to 15, n is an integer from 0 to 15, and "m+n" is an integer from 5 to 30.

In the formulae (2) and (4), preferably, r is an integer from 1 to 8, s is an integer from 0 to 2, p is an integer from 5 to 25, "r+s" is an integer from 1 to 10, A is an oxygen atom (—O—), an oxycarbonyl group (—COO—), or a dimethylsilyl group (—Si(CH$_3$)$_2$—).

In the formulae (1) through (4), preferably, q is an integer from 0 to 2, and X is halogen, alkoxy, or isocyanate, wherein X may be identical to each other, or different from each other if "X$_{3-q}$" is "X$_3$ or X$_2$". In the formulae (1) through (4), preferably, R is a hydrogen atom or a hydrocarbon group. The hydrocarbon group may be an unsaturated hydrocarbon group or a saturated hydrocarbon group, wherein the number of carbon atoms is preferably from 1 to 3. An example of "—SiR$_q$X$_{3-q}$" in the formulae (1) through (4) is the terminal-bonding functional group as mentioned above.

Preferred examples of the organic molecules as represented by the above formulae (1) through (4) are following formulae (11) through (44).

$$CF_3(CF_2)_7(CH_2)_2 SiCl_3 \quad (11)$$

$$F(CF_2)_4(CH_2)_2 O(CH_2)_{15} SiCl_3 \quad (12)$$

$$CF_3 COO(CH_2)_{15} SiCl_3 \quad (13)$$

$$F(CF_2)_4(CH_2)_2 Si(CH_3)_2(CH_2)_9 SiCl_3 \quad (14)$$

$$F(CF_2)_8 Si(CH_3)_2(CH_2)_9 SiCl_3 \quad (15)$$

$$CF_3(CH_2)_2 Si(CH_3)_2(CH_2)_{15} SiCl_3 \quad (16)$$

$$CF_3 CH_2 O(CH_2)_{15} SiCl_3 \quad (17)$$

$$CH_3(CH_2)_7(CH_2)_2 SiCl_3 \quad (18)$$

$$H(CH_2)_4(CH_2)_{20}(CH_2)_{15} SiCl_3 \quad (19)$$

$$CH_3 COO(CH_2)_{15} SiCl_3 \quad (20)$$

$$H(CH_2)_4(CH_2)_2 Si(CH_3)_2(CH_2)_9 SiCl_3 \quad (21)$$

$$H(CH_2)_8 Si(CH_3)_2(CH_2)_9 SiCl_3 \quad (22)$$

$$CH_3(CH_2)_2 Si(CH_3)_2(CH_2)_{15} SiCl_3 \quad (23)$$

$$CH_3 CH_2 O(CH_2)_{15} SiCl_3 \quad (24)$$

$$CH_3(CH_2)_{17} SiCl_3 \quad (25)$$

$$CH_3(CH_2)_{18} SiCl_3 \quad (26)$$

$$CF_3(CH_2)_9 SiCl_3 \quad (27)$$

$$CH_3(CH_2)_9 SiBr_3 \quad (28)$$

$$CF_3(CH_2)_6 SiBr_3 \quad (29)$$

$$CH_3(CH_2)_9 SiH_2 Cl \quad (30)$$

$CH_3(CH_2)_9Si(CH_3)_2(OCH_3)$ (31)

$CF_2H(CF_2)_2(CH_2)_2SiH_2Cl$ (32)

$CF_3(CH_2)_2(CH_3)_2Si(CH_2)_{15}SiCl_3$ (33)

$CF_3(CF_2)_3(CH_2)_2(CH_3)_2Si(CH_2)_9SiCl_3$ (34)

$CF_3(CF_2)_7(CH_2)_2(CH_2)_2Si(CH_2)_9SiCl_3$ (35)

$CF_3(CF_2)_7Si(CH_3)_2(CH_2)_9SiCl_3$ (36)

$CF_3(CF_2)_6Si(CH_3)_2(OCH_3)$ (37)

$CF_3(CF_2)_6SiCl_3$ (38)

$CF_3(CF_2)_7(CH_2)_2Si(OCH_3)_3$ (39)

$CF_3(CF_2)_7(CH_2)_2SiBr_3$ (40)

$CF_3(CF_2)_7(CH_2)_2Si(NCO)_3$ (41)

$CF_3(CF_2)_6SiH_2Cl$ (42)

$CF_3(CF_2)_7(CH_2)_2SiH_2Cl$ (43)

$CF_3(CF_2)_7(CH_2)_2Si(CH_3)_2(OCH_3)$ (44)

As the critical surface energy (mN/m) of the organic molecular film to be formed on the surface of the base member is lowered, water repellency is improved. In view of this, it is preferable that the property functional group of the organic molecule has a fluorine atom. Particularly, an organic molecule having carbon trifluoride is preferred. Specifically, the following organic molecule is preferred.

Whereas a critical surface energy of a general fluorocarbon resin is in the range from 15 to 18 mN/m, a critical surface energy of an organic molecular film made of e.g., heptadecafluorodecyldimethylsilylnonyltrichlorosilane ($CF_3(CF_2)_7Si(CH_3)_2(CH_2)_9SiCl_3$) is about 8 mN/m, which is considerably lower than that of the general fluorocarbon resin.

Further, there is a close relation between the number of fluorine atoms in the organic molecule, and the critical surface energy of the organic molecular film. The critical surface energy can be reduced by increasing the number of fluorine atoms. In view of this, it is preferable to use an organic molecule having a larger number of fluorine atoms to improve water repellency of the organic molecular film. Particularly, it is preferable that the property functional group has a larger number of fluorine atoms at a terminal thereof. The number of fluorine atoms in the organic molecule preferably ranges from 3 to 34, more preferably from 7 to 29, and particularly preferably from 13 to 25.

One or more kinds of organic molecules may be used to form the organic molecular film. In case of using two or more kinds of organic molecules, non-affinity to the liquid can be finely controlled by selecting the combination of organic molecules and setting the mixing ratio of the organic molecules. Thus, the organic molecular film optimized for the liquid to be crystallized can be desirably and easily formed.

As far as the base member has an active hydrogen atom on the surface thereof to form a covalent bond to the organic molecule by reaction with the organic molecule, the kind of the group having an active hydrogen atom is not specifically limited. Examples of the group having an active hydrogen atom are a hydroxyl group, a carboxyl group, a sulfonic acid group, a sulfinic acid group, a phosphoric acid group, a phosphorous acid group, a quarternary aluminum group, a quarternary phosphonium group, a thiol group, an amino group, and a sulfate ester group. It should be noted that, in the embodiment of the present invention, the expression "having an active hydrogen atom on the surface of the base member" means that the active hydrogen atom is exposed on the surface of the base member.

The material of the base member is not specifically limited. Examples of the material constituting the substrate (base member) are well-known materials including inorganic materials such as glass, mica, quartz, quart, and silicon; various polymers such as acryl resin, polycarbonate, polystyrene, vinyl chloride, epoxy resin, silicone resin (polydimethylsilicone), and polymethylmethacrylate (PMMA), and polycarbonate; ceramics; and metals. Among these, a base member made of glass or quartz is preferred, because there exist hydroxyl groups on the surface of the base member with abundant hydrogen atoms, and these active hydrogen atoms are easily covalently bound to the terminal-bonding functional groups of the organic molecules.

Further, even if a base member has no or less active hydrogen atom on the surface thereof, the reaction with the organic molecule is enabled by performing a process of introducing or giving active hydrogen atoms on the surface of the base member. The active hydrogen atoms can be introduced by a well-known method. Examples of the well-known method are chemical oxidative treatment, and physical treatment such as plasma treatment in the presence of oxygen, and ozone treatment. Further, there is a process of rendering the surface of the base member hydrophilic with use of $SiCl_4$, $HSiCl_3$, $SiCl_3O\text{---}(SiCl_2\text{---}O)_n\text{---}SiCl_3$ where n is an integer of not smaller than 0 and not larger than 6, or $Si(OH)_4$, $HSi(OH)_3$, $Si(OH)_3O\text{---}(Si(OH)_2\text{---}O)_n\text{---}Si(OH)_3$ where n is an integer of not smaller than 0 and not larger than 6, or a like compound.

Specifically, the surface of the base member can be oxidized by irradiating UV rays onto the surface of the base member in the existence of oxygen and hydrogen atom donors. According to this method, oxygen is decomposed by UV irradiation to thereby generate ozone, and the ozone is reacted with the hydrogen atom donors, thereby generating active species including active hydrogen atoms. While the UV rays are irradiated onto the surface of the base member, the covalent bonds between the atoms on the surface of the base member is broken, with the result that dangling bonds are formed. The active hydrogen atoms are then introduced to the surface of the base member by allowing the active species including the active hydrogen atoms to bond to the dangling bonds on the surface of the base member.

Examples of the hydrogen atom donor are water and ammonia. In the case where water is used as the hydrogen atom donor, —OH group serves as an active hydrogen moiety on the surface of the base member. In the case where ammonia is used as the hydrogen atom donor, —NH group serves as an active hydrogen moiety.

It is possible to adopt corona treatment, plasma treatment, or the like, in place of UV irradiation.

Further, the organic molecular film may be formed by direct covalent bonding of organic molecules to the surface of the base member, or the organic molecular film may be formed on the base member via a protective layer.

Next, an exemplified method for producing the substrate formed with the organic molecular film on the surface of the base member is described. A method for forming the organic molecular film is not specifically limited to the following. The organic molecular film can be produced by the methods as disclosed in Japanese Unexamined Patent Publication Nos. 4-132637, 4-256466, and 10-180179, for instance. Examples of the organic molecular film forming method are chemical adsorption method and Langmuir-Blodgett (LB) technique.

The following is an example of the chemical adsorption method.

First, a chemical adsorptive solution is prepared by dissolving organic molecules in a solvent.

The solvent can be optionally selected depending on the kind of the organic molecule to be used. Examples of the solvent are hexadecane, chloroform, carbon tetrachloride, silicone oil, hexane, and toluene. These solvents may be used alone or in combination of two or more kinds thereof. Among these, a mixed solvent of hexadecane, chloroform, and carbon tetrachloride is preferred. The concentration of the organic molecules in the chemical adsorptive solution is not specifically limited, but the concentration from about $3\times10^{-2}$ to $1\times10^{-1}$ M is preferred.

Next, the base member is contacted with the chemical adsorptive solution. Thereby, the aforementioned dehydrohalogenation such as dehydrochlorination, or dealcoholation, or deisocyanation occurs between the active hydrogen atoms on the surface of the base member and the terminal-bonding functional groups of the organic molecules, and covalent bonds (e.g., siloxane bond (—Si—O—)) are formed between the organic molecules and the surface of the base member. Thus, an organic molecular film composed of the organic molecules is formed on the base member.

The method of contacting the base member with the chemical adsorptive solution is not specifically limited. Examples of the contact method include immersing the base member in the chemical adsorptive solution, and applying the chemical adsorptive solution onto the base member. A contact time of the base member with the chemical adsorptive solution is not specifically limited, but may be from several seconds to 10 hours, and preferably from 1 minute to 1 hour. Further, the temperature of the chemical adsorptive solution may be in the range from 10 to 80° C., and preferably from 20 to 30° C.

In the case where the mono-molecular film or the layered-molecular film is formed as the organic molecular film, it is preferred to react the organic molecules with active hydrogen atoms on the surface of the base member in a dry state, as recited in Japanese Unexamined Patent Publication No. 4-256466, for example, to prevent condensation of the organic molecules before the organic molecules are covalently bound to the surface of the base member. Specifically, it is preferred to contact the base member with the chemical adsorptive solution under dry air, or in a dry atmosphere of nitrogen, argon gas or the like. Particularly, it is preferred to set the amount of water vapor in an atmosphere lower than 6.80 g/m$^3$, more preferably 5.80 g/m$^3$, or lower. Therefore the relative humidity at 22° C. is preferably lower than 35% (more preferably 0 to 30%), for example.

In case of forming the adjoining-molecule-bonding film as the organic molecular film, it is preferred to react the organic molecules with each other and to react each organic molecule with the surface of the base member in an atmosphere of water vapor of 6.80 g/m$^3$ or more preferably 8.80 g/m$^3$ or more. Therefore the relative humidity at 22° C. is preferably 35% or more (more preferably 45% or more), for example. Further, in the case where the organic molecules are covalently bound to each other, and each organic molecule is covalently bound to the surface of the base member and to the surfaces of the particles in the presence of the particles to form the organic molecular film having asperities on the surface of the base member, it is preferred to react the organic molecules with the active hydrogen atoms on the surface of the base member and on the surfaces of the particles in an atmosphere of the water vapor of 6.80 g/m$^3$ or more. In the case of using the layered-molecular film as the organic molecular film, the layered-molecular film can be formed in a similar manner as forming the mono-molecular film by forming a mono-molecular film on the base member as mentioned above, and subjecting the surface of the mono-molecular film to active hydrogen donating process (e.g., hydrophilic treatment). A layered-molecular film having a desired number of layered organic molecules can be formed by cyclically repeating the active hydrogen donating process and the chemical adsorption a predetermined number of times.

In the case where the surface of a mono-molecular film formed on the surface of the base member as a first layer has an unsaturated group such as a vinyl group, it is possible to introduce a hydroxyl group (—OH) by irradiating an energy beam such as an electron beam or an X-ray in an atmosphere containing moisture. Further, a carbonyl group (—COOH) can be introduced by immersing the base member formed with the first layer in an aqueous solution of potassium permanganate, for instance.

The organic molecular film may be formed over the entirety on the surface of the base member, or may be selectively and locally formed on a corresponding site of the base member where the liquid to be crystallized is contacted with the substrate in crystallization of the material to be crystallized. A method for selectively and locally forming the organic molecular film on the base member is not specifically limited, and the following are examples of the method.

According to a first method, after an organic molecular film is formed over the entirety on a surface of a base member, the organic molecular film formed at an unnecessary region on the surface of the base member is removed. Specifically, after an organic molecular film is formed on a surface of a base member, photo mask of covering a necessary region is formed. Then, UV rays are irradiated onto the surface of the base member to remove the organic molecular film at the unnecessary region where the photo mask is not formed. In the case where a laser such as an excimer laser is used as means for irradiating UV rays, it is possible to perform spot irradiation of UV rays with respect to a specific region of the organic molecular film. Since the organic molecular film used in the embodiment of the present invention is very thin, there is no likelihood that partial removal of the organic molecular film may cause variation in film thickness or a like phenomenon. It is possible to adopt corona treatment, plasma treatment or a like treatment, other than the UV irradiation. Conducting one of these methods in the presence of oxygen enables to remove the organic molecular film at a desired region from the surface of the base member by oxidation.

According to a second method, a resist pattern is formed on a surface of a base member to cover a region where it is not necessary to form an organic molecular film. After contacting a solution containing organic molecules with the surface of the base member formed with the resist pattern, the resist pattern is removed, whereby the organic molecular film is selectively and locally formed on the surface of the base member.

According to a third method, an organic molecular film is selectively and locally formed on a surface of a base member by contacting a solution containing organic molecules with a region of the surface of the base member where it is necessary to form the organic molecular film by an inkjet method, a stamp method, or a like method.

Property functional groups derived from the organic molecules are introduced onto the substrate surface by forming the organic molecular film according to one of the aforementioned methods, and thus, the substrate surface exhibits non-affinity to the liquid. Use of the inventive substrate is advantageous in efficiently and stably crystallize the material to be crystallized, because the contact area of the liquid to be crystallized with the substrate surface is minimized in crystallizing the material to be crystallized.

The inventive substrate is used in the following manner.

First, in case of crystallizing a protein with use of the inventive substrate, it is preferable to use a purified liquid to be crystallized. An exemplified purification method is a conventional method used in purification of proteins including electrophoresis (SDS-PAGE, Native-PAGE, etc.), column chromatography, and other known purification methods.

A liquid to be crystallized is prepared by dissolving the protein in a buffer such as an acetic acid buffer in such a condition as not to break the protein structure. A solution of sodium chloride or polyethylene glycol (PEG 8000) having a molecular weight of 8,000 is added in the liquid to be crystallized according to needs.

Next, the substrate is placed in an apparatus whose atmospheric conditions such as a vapor pressure and a temperature are controllable, and the liquid to be crystallized which has non-affinity to the organic molecular film formed on the substrate surface is dropped onto the substrate surface. The method of dropping the liquid is not specifically limited. The liquid may be dropped with use of a micro syringe, a micropipette, or an ink jet device.

A liquid droplet formed on the substrate surface has a substantially spherical shape due to the non-affinity of the organic molecular film to the liquid. Since the liquid droplet is substantially spherical, the droplet is likely to roll over the substrate surface. Therefore, it is preferable to form the rolling-preventive indented portion in the substrate for keeping the liquid droplet from rolling.

The liquid droplet gradually transpires isotropically from the spherical surface thereof, and finally, the material to be crystallized in the liquid is crystallized.

As a crystallization method, it is possible to allow the solvent in the liquid to be crystallized to transpire, or to lower the temperature of the liquid to be crystallized to an oversaturated temperature or below in order to bring the liquid to be crystallized to an oversaturated state. To implement such a method, it is required to install a particularly precise temperature regulating mechanism in the apparatus. An optimal temperature rising or falling velocity can be selected depending on the kind of the material to be crystallized.

Further, it is required to control the atmosphere such as an acidic atmosphere, so that an optimal condition can be selected depending on the kind of the material to be crystallized.

In case of allowing the liquid droplet to transpire, the droplet gradually transpires isotropically from the substantially spherical surface thereof, and finally, the material to be crystallized is crystallized.

While the droplet transpires, the solvent component in the droplet evaporates as the crystallization progresses, and accordingly, the size of the droplet is diminished. At a final stage of evaporation, the concentration of the material to be crystallized is increased. In some cases, the concentration of the material to be crystallized reaches an oversaturated concentration beyond the saturated concentration, thereby generating crystals at a final stage. It is possible to promote generation of crystals by imparting a stimulus at a transient stage while the concentration is relatively high to obtain purified crystals. Examples of the stimulus are vibrations (sound waves), and light (laser light).

Single crystals can be efficiently obtained by optimizing the atmospheric condition while the liquid droplet transpires in the above manner.

The optimal atmospheric condition for crystallization of proteins or the like differs depending on the kind of the material to be crystallized. Accordingly, normally, it is extremely difficult to find an optimal atmospheric condition, and such optimal atmospheric condition is selected as a result of trial and error by changing conditions. However, according to the embodiment of the present invention, as mentioned above, multitude of atmospheric conditions can be carried out simultaneously by forming a number of indented portions in the substrate and by changing the atmospheric conditions in the respective indented portions, which makes it possible to select an optimal atmospheric condition in a short time.

It is possible to allow the liquid to be crystallized to transpire on the inventive substrate while oscillating the substrate, as a method for efficiently obtaining single crystals. This method makes it possible to form a liquid droplet into a true sphere or a shape analogous to a true sphere, which contributes to isotropic transpiration.

As mentioned above, the inventive substrate can be used in the various well-known crystallization apparatuses. In other words, the arrangement of a crystallization apparatus according to the embodiment of the present invention is not restricted, as far as it is possible to place the inventive substrate at a site contactable with the liquid to be crystallized in crystallization. Thus, the inventive crystallization apparatus can be constructed by optionally combining various elements constituting the apparatus, e.g., means for controlling parameters such as temperature, humidity, and concentration of solvent vapor with each other, depending on the crystallization method.

The inventive substrate is advantageous in efficiently crystallizing polymeric compounds including biomolecules such as proteins, nucleic acids, and sugars; and resins, as well as inorganic compounds. Thus, the inventive substrate is useful in various fields such as pharmaceutical/biochemical field, as well as catalyst development and material development. The inventive substrate is particularly useful in a so-called combinatorial chemistry according to which a multitude of conditions are simultaneously executable, because an optimal crystallization condition can be selected easily with use of the inventive substrate.

EXAMPLES

In the following, the present invention is illustrated in detail with Examples, which however, do not limit the invention. Adequate modification is allowable as far as it does not depart from the object of the present invention described above or below, and every such modification is intended to be embraced in the technical scope of the present invention.

Methods for measuring a surface roughness of a substrate, a height of a protrusion, an area ratio of protrusions relative to the surface of a base member (substrate), and a contact angle of a liquid droplet relative to the substrate surface are as described below.

(Methods for Measuring Height of Protrusion, and Surface Roughness)

The surface states of base members and substrates to be observed were observed through a scanning electron microscope (SEM), and the surface roughness and the height of the protrusion of asperities were measured.

The height of the protrusion was calculated by measuring a height difference between an apex of a target protrusion and a point on a bottom part of a recess adjacent to the protrusion with respect to plural protrusions, and by calculating an average of the height differences, using images observed through the SEM.

The method of calculating the surface roughness was in accordance with JIS B0601-1994.

(Method for Measuring Area Ratio of Protrusions Relative to Surface of Substrate (Base Member))

Images of the surface states of the base members and the substrates formed with asperities were photographed by the SEM.

Binary process was performed with respect to the photographed images by image processing, and the area ratio of the protrusions relative to the entire area of each observed image was calculated.

(Method for Measuring Contact Angle)

4 μl of water as a specimen was dropped on each substrate, and a liquid droplet of about 3 mm in diameter was formed. Immediately after the dropping, the contact angle of the droplet relative to each substrate surface was measured with use of a static contact angle meter (product name "contact angle meter" produced by Kyowa Interface Science Co., Ltd.).

The following are organic molecules for forming organic molecular films used in examples of the present invention, and corresponding identification codes.

| | |
|---|---|
| $CF_3(CF_2)_7(CH_2)_2SiCl_3$ | organic molecule F17a |
| $CH_3(CH_2)_{18}SiCl_3$ | organic molecule F0 |
| $CF_3(CH_2)_2(CH_3)_2Si(CH_2)_{15}SiCl_3$ | organic molecule F3 |
| $CF_3(CF_2)_3(CH_2)_2(CH_3)_2Si(CH_2)_9SiCl_3$ | organic molecule F9 |
| $CF_3(CF_2)_7(CH_2)_2(CH_3)_2Si(CH_2)_9SiCl_3$ | organic molecule F17 |
| $CF_3(CF_2)_3(CH_2)_6SiCl_3$ | organic molecule F9a |
| $CF_3(CF_2)_9SiCl_3$ | organic molecule F3a |
| $CH_3(CH_2)_{17}SiCl_3$ | organic molecule OTS |

Example 1

(1) Surface Treatment of Plastic Base Member

A polyethyleneterephthalate (PET) film of 100 μm in thickness each was placed in a reaction chamber, and glow discharge treatment was conducted with an etching power of 40 W/cm² for a predetermined duration (3 minutes, and 10 minutes) with use of a plasma etching device with a parallel flat plate electrode under an atmosphere of oxygen gas of about 10 Pa in pressure. After the treatment, the film surfaces were observed through a scanning electron microscope (SEM). The results of observation are as shown in FIGS. 2A and 2B.

Figure 2A:
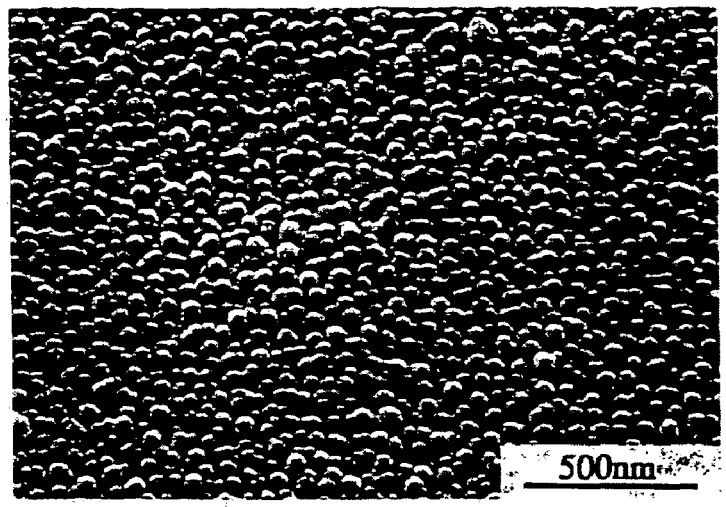
FIGS. 2A and 2B are SEM photos each showing a surface of a PET film formed with asperities at (1) in Example 1 of the present invention.
Figure 2B:
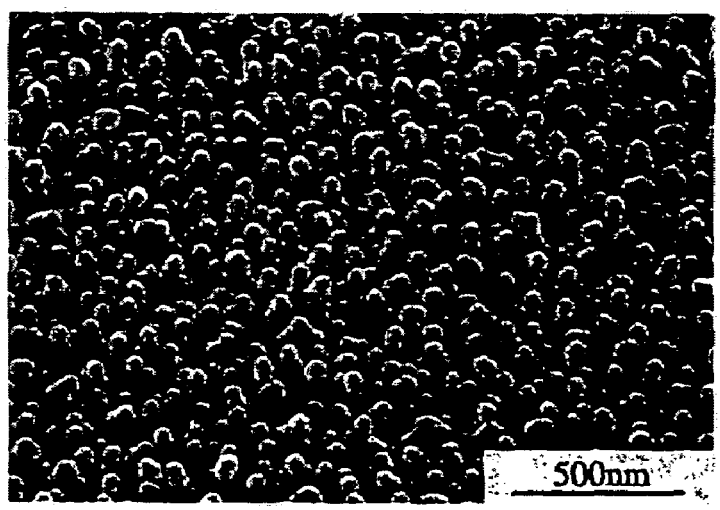

As shown in the SEM photos of FIGS. 2A and 2B, asperities were formed on the PET film surfaces. Specifically, the height of the protrusion on the film surface obtained by the glow discharge for 3 minutes was about 50 nm, with a surface roughness of about 30 nm, and the height of the protrusion on the film surface obtained by the glow discharge for 10 minutes was about 170 nm, with a surface roughness of about 50 nm.

(2) Surface Treatment of Glass Base Member

A $SiO_2$ sputter film (thickness: 600 nm) was formed on the surface of a glass base member (product name: #7059 produced by Dow Corning Corp.) with use of silicon oxide.

Subsequently, plasma etching was conducted for 2 minutes with use of $CHF_3/O_2$ gas as a reaction gas under a pressure of 120 Pa and with an etching power of 1.17 W/cm². The surface of the glass base member after the etching was observed through the SEM. The result of observation is as shown in FIG. 3.

Figure 3:
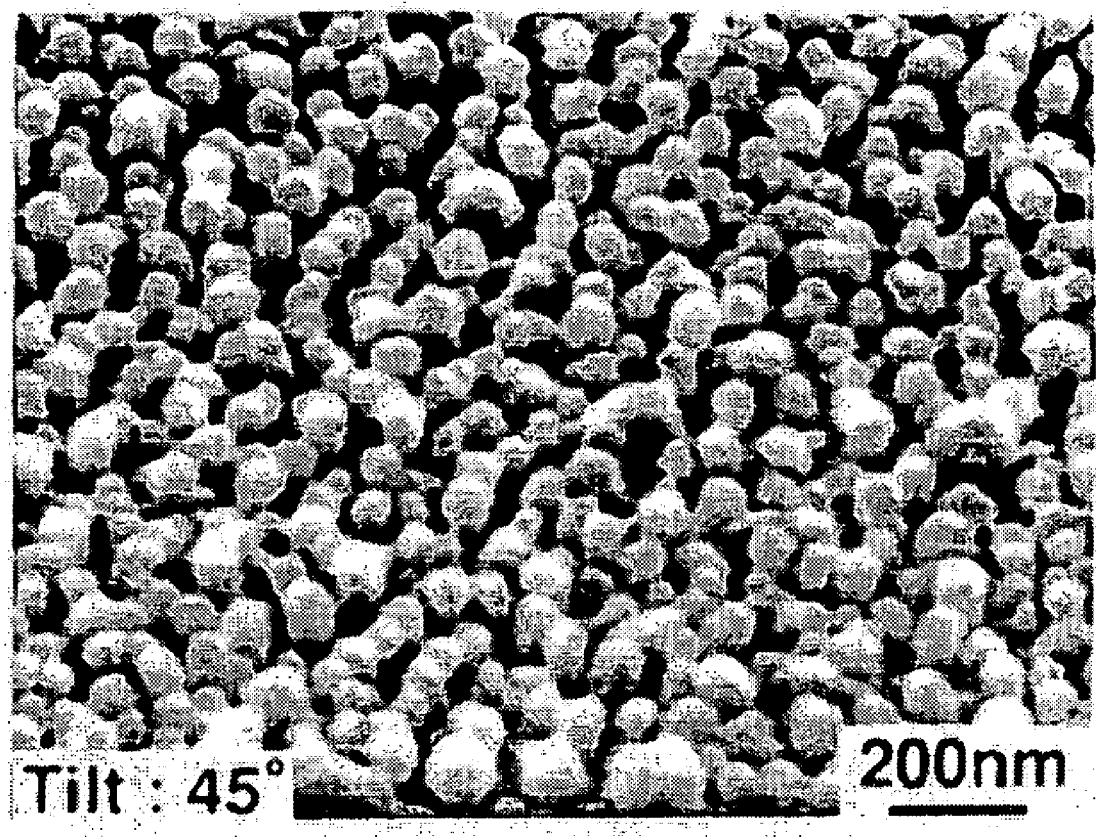
FIG. 3 is an SEM photo showing a surface of a glass base member formed with asperities at (2) in Example 1 of the present invention.

As shown in the SEM photo of FIG. 3, asperities were formed on the surface of the glass base member. Specifically, the height of the protrusion was about 150 nm, the surface roughness was about 50 nm, and the tilt angle of the protrusion measured on an electron micrograph was 45° relative to the surface of the glass base member.

(3) Formation of Mono-Molecular Film

A PET film having the height of the protrusion of about 170 nm and a surface roughness of 50 nm was obtained by forming asperities on a surface of a PET film in a similar manner as the surface treatment (1).

Next, a chemical adsorptive solution was prepared by admixing the organic molecules F17a, which is an alkyl-fluoride-based silane coupling agent (produced by Shin-Etsu Chemical Co., Ltd.), to a non-aqueous solution of perfluoro solvent (trade name "PF5080" produced by Sumitomo 3M Ltd.), so that the content of the organic molecules F17a was 2% by mass relative to the total content of the solution.

A mono-molecular film was formed on a surface of a base member by immersing the PET film as the base member in the chemical adsorptive solution, and letting it stand for 1 hour at room temperature (20° C.) in a dry atmosphere of nitrogen gas (relative humidity: 5%), whereby a substrate was obtained. The mono-molecular film had a thickness of 2 nm.

The surface of the substrate was observed by the SEM, and the height of the protrusion on the asperities, and a contact angle of a water droplet relative to the substrate surface by dropping the water droplet were measured.

As a result of the measurements, the height of the protrusion was 50 nm, and the contact angle of the water droplet relative to the substrate surface was 150°.

The contact angle was kept constant at 150° by setting the height of the protrusion on the substrate surface at 50 nm or higher.

Since the substrate in Example 1 was superior in water repellency, a droplet on the substrate surface was analogous to a true sphere, with a contact angle as large as 150°. The results reveal that the inventive substrate is advantageous in improving crystallization conditions for crystallizing organic polymers such as proteins because a contact area of the liquid to be crystallized with the substrate surface can be minimized by using the inventive substrate.

Example 2

Four kinds of base members each having protrusions of different heights were produced by forming asperities in a similar manner as (1) in Example 1 except that the plasma etching condition in the surface treatment (1) of Example 1 was changed.

Next, substrates were produced by forming a mono-molecular film on the surface of each of base members in a similar manner as the mono-molecular film formation (3) in Example 1.

The heights of the protrusions of asperities on the respective substrates were 30 nm, 50 nm, 200 nm, and 500 nm.

The requirements for producing the substrates were as follows.

In case of producing the substrate having asperities with the height of the protrusion of 30 nm, the surface of the base member was treated in an atmosphere of oxygen gas of about 10 Pa in pressure, with an etching power of 40 W/cm² for 2 minutes. In case of producing the substrate having asperities with the height of the protrusion of 50 nm, the surface of the base member was treated in an atmosphere of oxygen gas of about 10 Pa in pressure, with an etching power of 40 W/cm² for 3 minutes. In case of producing the substrate having asperities with the height of the protrusion of 200 nm, the surface of the base member was treated in an atmosphere of oxygen gas of about 10 Pa in pressure, with an etching power of 40 W/cm² for 15 minutes. In case of producing the substrate having asperities with the height of the protrusion of 500 nm, the surface of the base member was treated in an atmosphere of oxygen gas of about 10 Pa in pressure, with an etching power of 40 W/cm² for 25 minutes.

A transmission of visible rays was measured with respect to each of the substrates. A transmission of visible rays of an untreated PET film without formation of asperities or a mono-molecular film was measured as a control sample. The results of measurements are as shown in FIG. 4.

Figure 4:
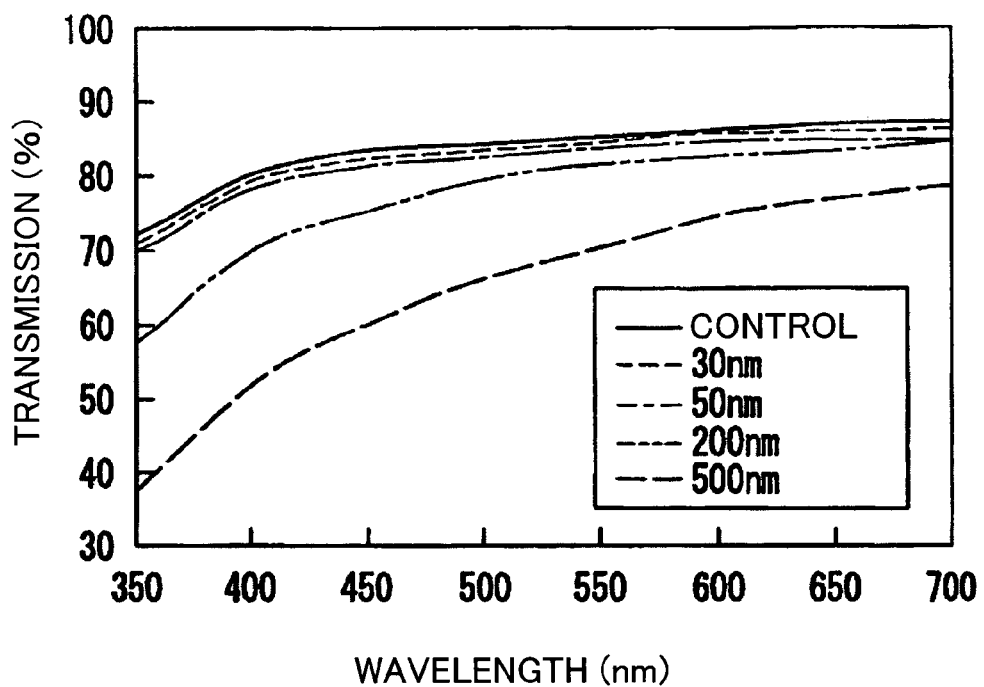
FIG. 4 is a graph showing a relation between light transmission and a height of a protrusion of asperities formed on a surface of a PET film in Example 2 of the present invention.

FIG. 4 is a graph showing a relation between light transmission and wavelength with respect to each of the substrates. In FIG. 4, "30 nm, 50 nm, 200 nm, and 500 nm" represent the respective heights of the protrusions of asperities on the corresponding substrates. As is obvious from FIG. 4, the transmissions of visible rays at 550 nm of the substrates having asperities with the heights of the protrusions of 30 nm, 50 nm, and 200 nm were 84%, 83%, and 81%. The transmission of visible rays of the substrate as the control sample was 85%, which was substantially the same as those of the substrates having asperities with the heights of the protrusions of 30 nm, 50 nm, and 200 nm. The transmission of visible rays at 550 nm of the substrate having asperities with the height of the protrusion of 500 nm was 70%, which was relatively low, as compared with the transmissions of the other substrates.

The following is an analysis on the results of transmission measurements. Specifically, it is a general practice to observe growth of crystal nuclei through a microscope in crystallization. An inverted microscope, which is normally used in the observation, is constructed such that the degree of growth of crystal nuclei is measured by way of light transmitted through a substrate. Accordingly, a high degree of transparency of the substrate is required. Further, since measurement by transmissive light is generally conducted with microscopes other than the inverted microscope as well, transparency of the substrate is required in case of using such microscopes, similarly to the case of using the inverted microscope. The inventive method is advantageous in producing a substrate having superior light transmission.

Example 3

A glass base member having asperities with the height of the protrusion of 150 nm was produced by forming the asperities on a surface of the glass base member in a similar manner as the surface treatment (2) in Example 1. Then, a substrate was produced by forming a mono-molecular film on the surface of the base member in a similar manner as the mono-molecular film formation (3) in Example 3.

A transmission of visible rays of the substrate was measured. Likewise, measurement was conducted with respect to a glass base member without formation of asperities or a mono-molecular film, as a control sample. The results of measurements are as shown in FIG. 5.

Figure 5:
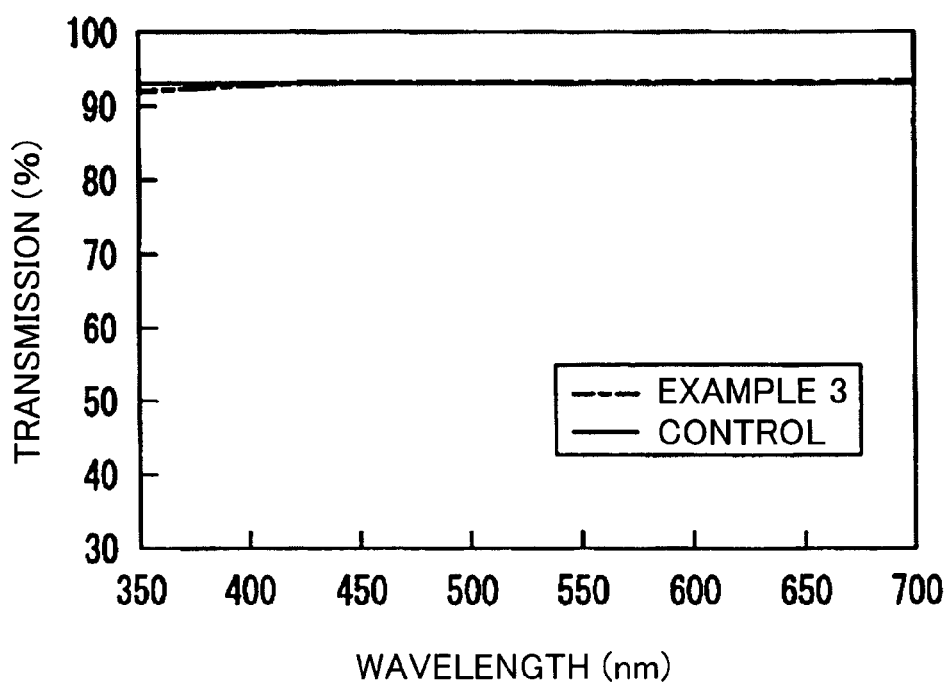
FIG. 5 is a graph showing a relation between light transmission and a height of a protrusion of asperities formed on a surface of a glass base member in Example 3 of the present invention.

FIG. 5 is a graph showing a relation between transmission and wavelength with respect to each of the substrates. As shown in FIG. 5, the transmission of visible rays of the inventive substrate was substantially the same as that of the substrate as the control sample. Particularly, the transmissions of visible rays of the inventive substrate and the control sample were substantially identical to each other at a wavelength region of 400 nm or longer.

Figure 6:
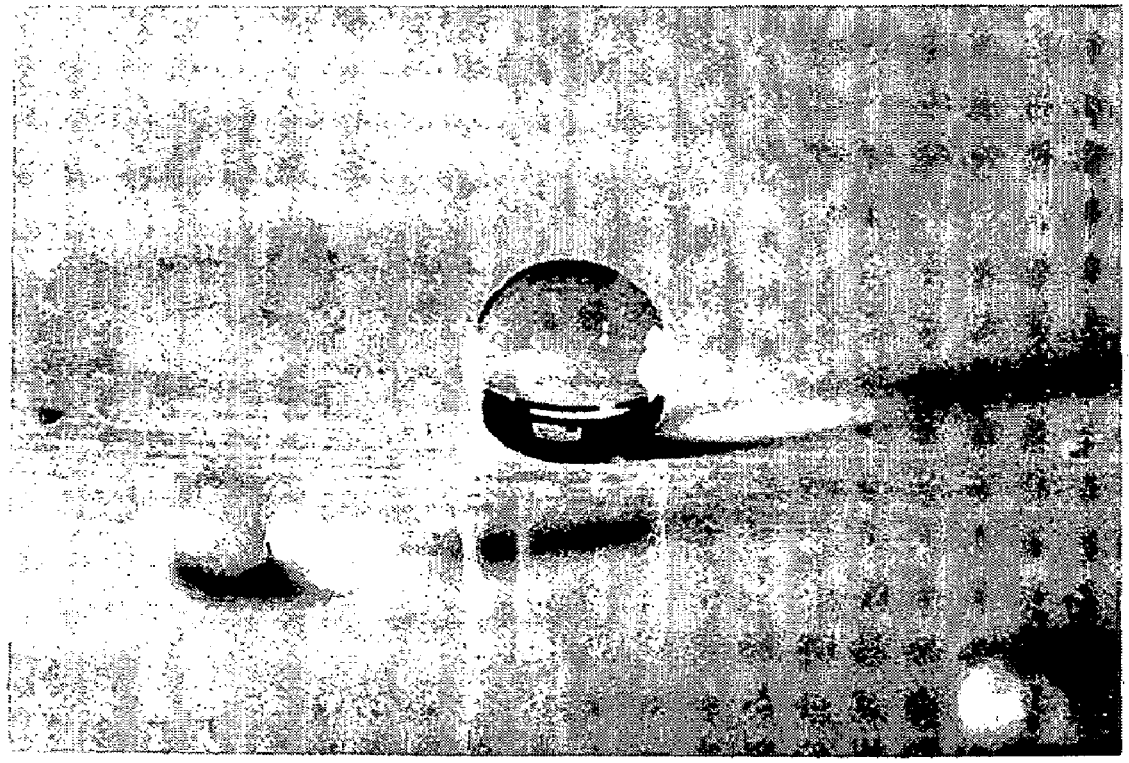
FIG. 6 is a perspective photo of a water droplet on a substrate in Example 3, showing water repellency of the substrate.

FIG. 6 is a photo showing a state that a water droplet of 4 μl was dropped on the substrate having asperities with the height of the protrusion of 150 nm. As is obvious from FIG. 6, the water droplet has a shape analogous to a true sphere, with a contact angle of the water droplet relative to the substrate surface of 160°. This reveals that the substrate in Example 3 has super water repellency.

Example 4

Critical surface energies of respective mono-molecular films composed of various organic molecules were measured. It is said that a mono-molecular film having a low critical surface energy exhibits superior water repellency and oil repellency.

The organic molecules F0, F3, F9, and F17 were used as the organic molecules for composing the mono-molecular films. Specifically, mono-molecular films were formed on the respective surfaces of untreated glass base members without formation of asperities.

The method of forming the mono-molecular films was the same as in (3) of Example 1 except that the aforementioned organic molecules were used.

Figure 7:
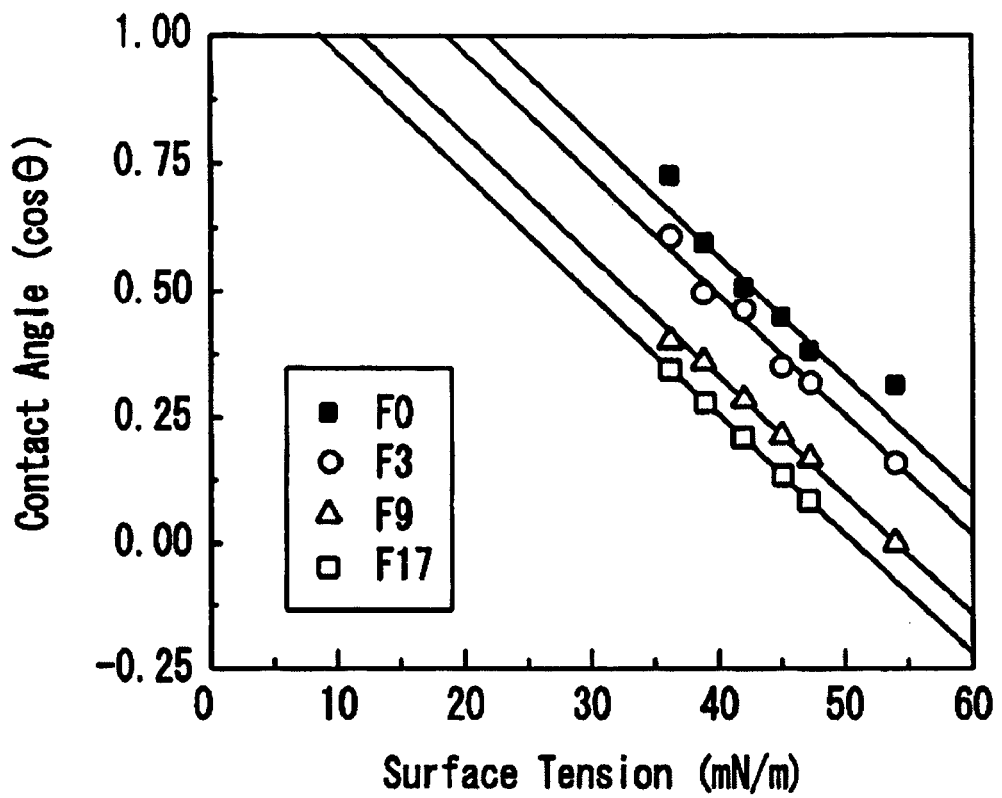
FIG. 7 is a graph showing a relation between a critical surface energy of a mono-molecular film, and the number of fluorine atoms in an organic molecule constituting the mono-molecular film.

The critical surface energy of each of the mono-molecular films was measured with use of the static contact angle meter (product name "contact angle meter" produced by Kyowa Interface Science Co., Ltd.). Specifically, as shown in the graph of FIG. 7, cosine values of contact angles of a water droplet relative to each substrate surface were plotted. An approximate straight line was drawn based on the plotted dots, extrapolation was conducted, and the surface tension when the cosine value was 1 was set as the critical surface energy with respect to each substrate. The critical surface energies were 22mN/m, 18mN/m, 13mN/m, and 9mN/m when the used organic molecules were F0, F3, F9, and F17, respectively. The results of measurements reveal that use of the organic molecule having a larger number of fluorine atoms lowers the critical surface energy. Thus, a substrate superior in water repellency and oil repellency can be produced by using an organic molecule having a larger number of fluorine atoms for composing an organic molecular film, in the case where the organic molecular film is formed on a base member.

Example 5

An SiO₂ film of about 0.5 μm in thickness was formed on an aluminum base member treated with glass lining (produced by Kobe Steel, Ltd.). Then, a coating material for forming an adjoining-molecule-bonding film was prepared by dispersing titanium oxide particles (product name "P25" produced by Japan Aerosil Company) of 21 nm in average diameter, and by diluting the organic molecules F17a (heptadecafluorodecyl-trichlorosilane containing hydrolyzable groups including Si and fluoroalkyl groups) with use of xylene as a non-aqueous solvent.

The concentrations of the titanium oxide particles and the organic molecules F17a were 5% by mass and 10% by mass relative to the total content of the mixture, respectively.

The coating material was coated on the aluminum base member with use of a brush, so that the thickness of the coat became in the range from 1 to 10 μm. Thereafter, the xylene was evaporated at room temperature in an atmosphere of relative humidity at 45%. At this time, the hydrolysable groups left on the base member were rapidly hydrolyzed with the moisture in the atmosphere. The inventors confirmed that a good result was obtained by setting the relative humidity at 35% or higher. As a result of the hydrolysis, dehydrochlorination occurred by reaction of the moisture in the atmosphere with chlorosilyl groups, whereby the adjoining-molecule-bonding film was formed on the surface of the base member.

The reaction was continued for about 10 minutes. As a result of the reaction, the base member and each organic molecule F17a were covalently bound to each other by a siloxane bond, and the adjoining organic molecules were covalently bound to each other by siloxane bonds. As a result, the adjoining-molecule-bonding film containing a polymer including the fluoroalkyl groups was formed on the surface of the substrate, with asperities formed on the substrate surface. The coat was hardly peeled off. The substrate had a surface roughness from 0.1 to 40 μm in average, and a contact angle of a water droplet relative to the substrate surface was 172°.

Figure 12:
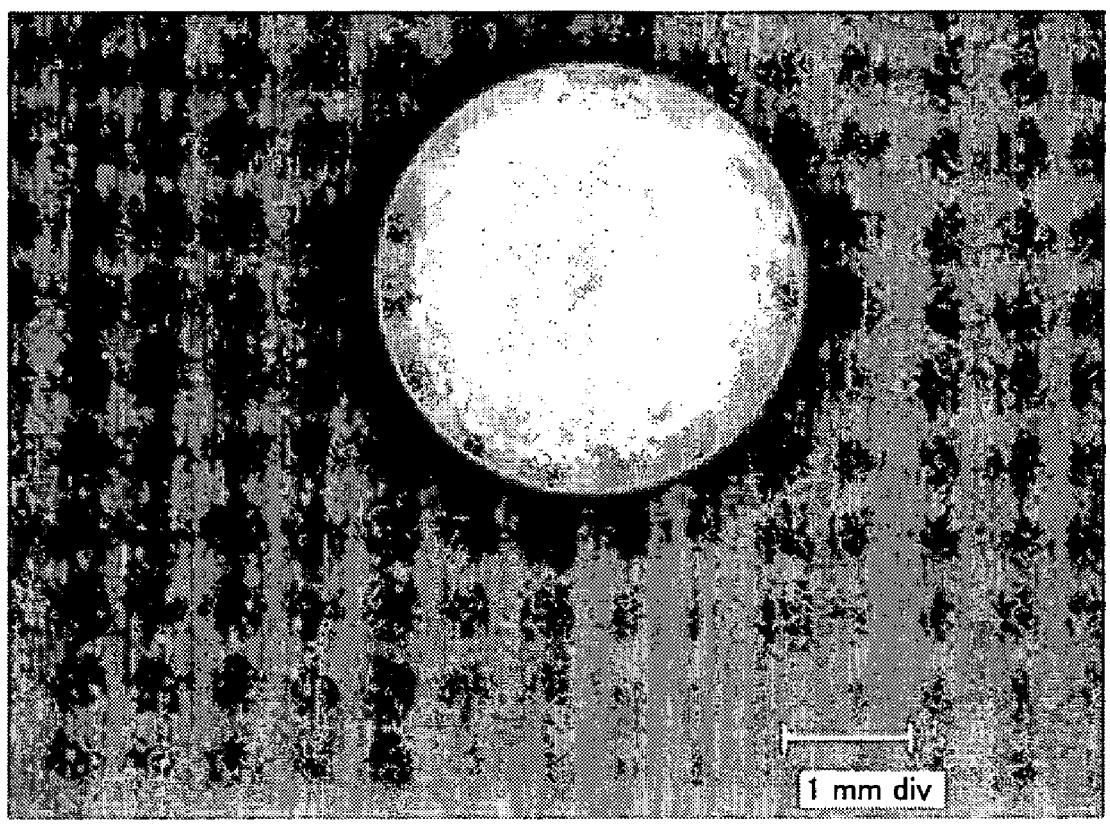
FIG. 12 is a micrograph taken from above showing a water droplet on a substrate in Example 5 of the present invention.
Figure 13:
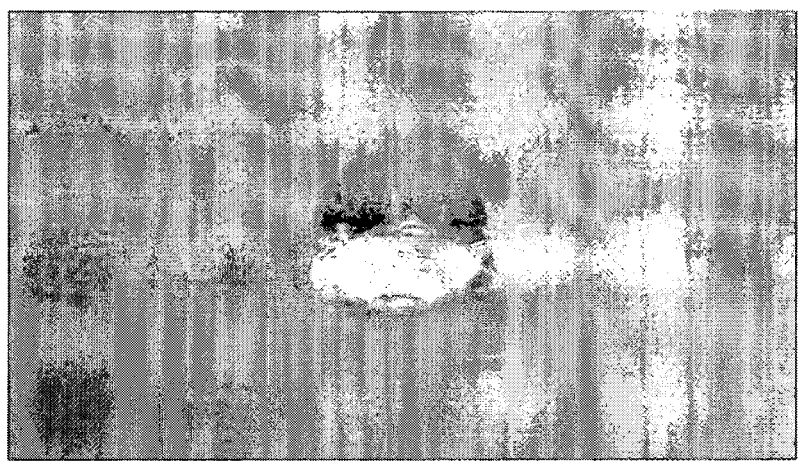
FIG. 13 is a perspective photo of the droplet on the substrate in Example 5, showing water repellency of the substrate.

A water droplet of 20 μl was dropped on the substrate surface. FIG. 12 is a micrograph taken from above, showing a state of the water droplet on the substrate surface. The radius of the droplet was 1.688 mm. FIG. 13 is a perspective photo of the substrate surface shown in FIG. 12. The state of the droplet in FIG. 13 clarifies super water repellency of the substrate surface.

Figure 14:
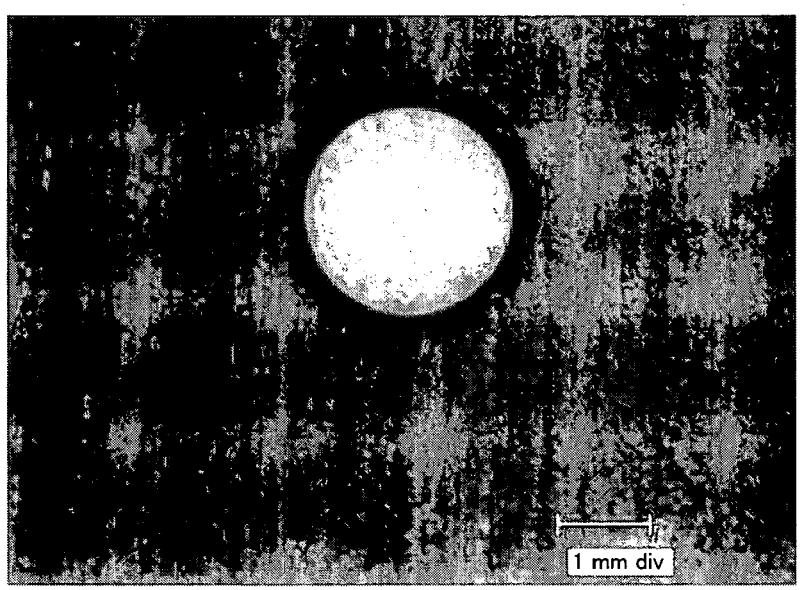
FIG. 14 is a micrograph taken from above showing a transient state of the droplet on the substrate in Example 5 under transpiration to show water repellency of the substrate.
Figure 15:
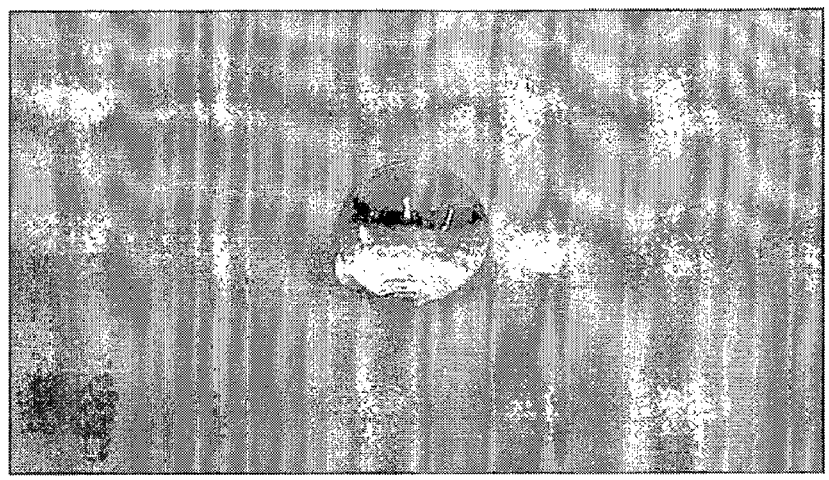
FIG. 15 is a perspective photo of the droplet on the substrate in Example 5 to show water repellency of the substrate.
Figure 16:
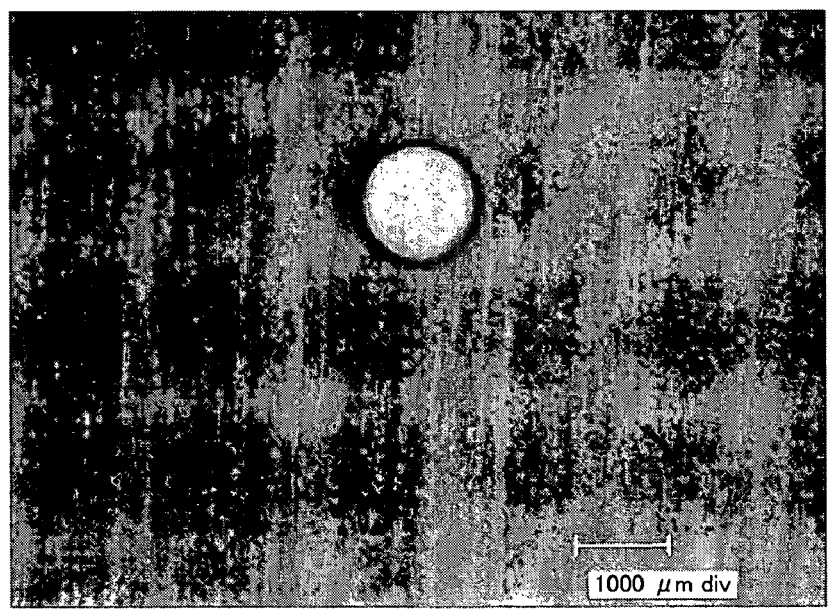
FIG. 16 is a micrograph taken from above showing a transient state of the droplet on the substrate in Example 5 under transpiration to show water repellency of the substrate.
Figure 17:
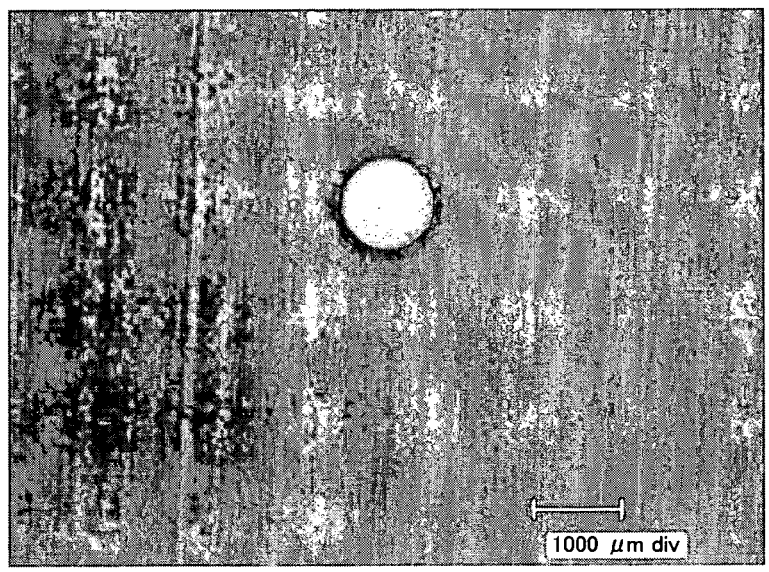
FIG. 17 is a micrograph taken from above showing a transient state of the droplet on the substrate in Example 5 under transpiration to show water repellency of the substrate.
Figure 18:
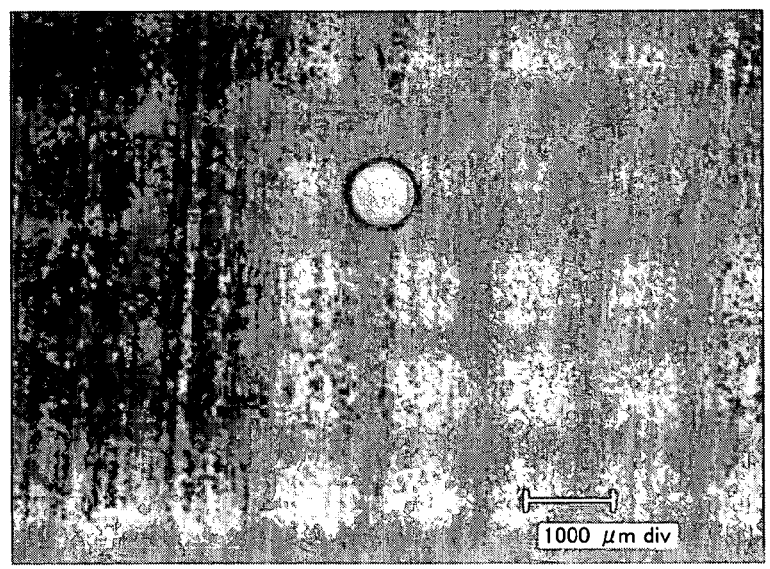
FIG. 18 is a micrograph taken from above showing a transient state of the droplet on the substrate in Example 5 under transpiration to show water repellency of the substrate.
Figure 19:
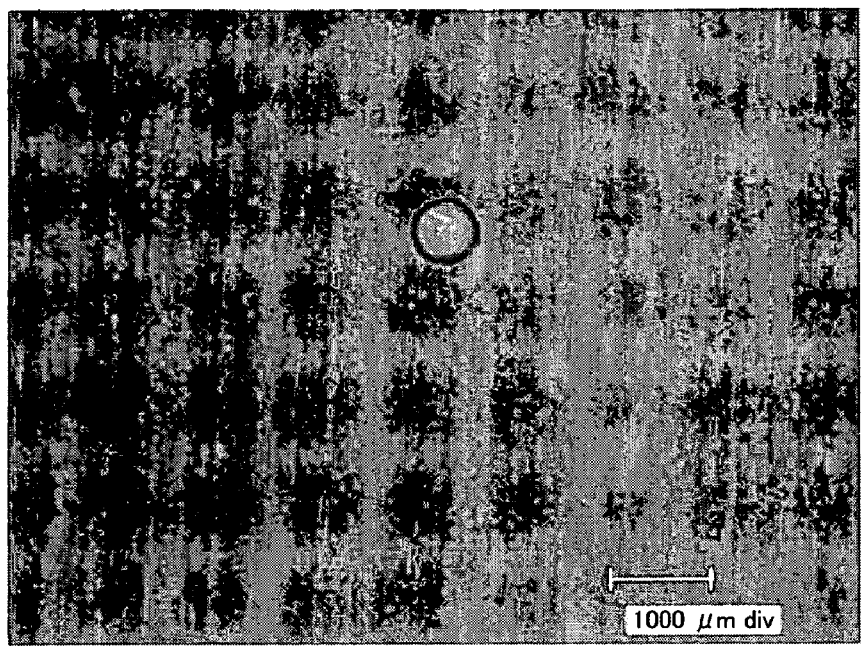
FIG. 19 is a micrograph taken from above showing a transient state of the droplet on the substrate in Example 5 under transpiration to show water repellency of the substrate.

The water droplet transpired on the substrate surface by keeping the atmosphere around the water droplet to room temperature of 22° C. and humidity of 57%. As a result, the droplet was changed to a state as shown in the micrograph of FIG. 14. Specifically, as shown in FIG. 14, the shape of the droplet was a circle in plan view, when viewed from above in a vertical direction with respect to the substrate surface, and the radius thereof was 1.105 mm. FIG. 15 is a perspective photo of the substrate surface shown in FIG. 14. The state of the droplet in FIG. 15 clarifies super water repellency of the substrate surface.

Figure 20:
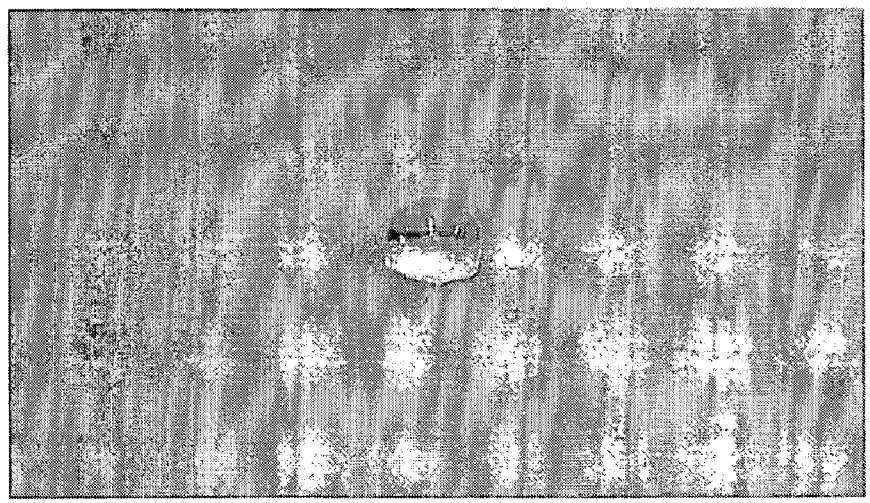
FIG. 20 is a perspective photo of the droplet on the substrate in Example 5 to show water repellency of the substrate.

Transient states of the droplet after the state shown in FIG. 15 are as shown in FIGS. 16 through 19. As shown in FIGS. 16 through 19, the droplet viewed from above in a vertical direction with respect to the substrate surface had its radius reduced from 0.546 mm to 0.384 mm, and then to 0.293 mm, while keeping its circular shape in plan view. FIG. 20 is a perspective photo corresponding to the micrograph of FIG. 19. As is obvious from FIG. 20, the droplet maintains its spherical shape. Based on these observations, it is conceived that the droplet transpires isotropically except at a contact site with the substrate surface, while the substrate surface retaining its super water repellency.

Examples 6 through 11

A silicon oxide film of 1 μm in thickness was formed on a silicon semiconductor wafer. Then, a negative photoresist was applied on the silicon oxide film according to a semiconductor photolithography. Thereafter, a resist pattern of 100 nm square was formed by irradiating laser light onto each silicon semiconductor wafer. Subsequently, the silicon semiconductor wafer formed with the resist pattern was placed in a dry etching device to etch the silicon oxide film. After the dry etching, the resist patterns was removed by a resist removing device.

The etching employed in the present invention has a feature that a resist pattern density can be varied by changing a site for irradiating laser light. An area ratio of protrusions to recesses can be changed in 5 steps from 95:5 to 5:95 with use of the etching device. In respective Examples 6 through 11, 6 patterns were formed on the silicon semiconductor wafer.

The organic molecules F17a, F9a, F3a, and OTS each in the content of 1.0% by mass was dissolved in a mixed solvent containing 4 parts by mass of hexadecane and 1 part by mass of chloroform.

Then, the silicon semiconductor wafer was immersed in the solution. Thus, a mono-molecular film was formed in a similar manner as the formation of mono-molecular film (3) in Example 1 except that the composition of the solution was changed as mentioned above.

The height of the protrusion of asperities on the semiconductor wafer was about 150 nm.

The contact angle of a water droplet relative to the wafer surface with respect to each of Examples 6 through 11 where the ratio of protrusions to recesses on the wafer surface, and the kind of organic molecule were changed is shown in Table 1.

TABLE 1

| Example No. | Surface configuration of wafer (ratio of protrusions(%)) | Kind of organic molecule | Contact angle of water droplet (degree) |
| --- | --- | --- | --- |
| 6 | 10 | F17a | 174 |
| 7 | 20 | F3a | 165 |
| 8 | 30 | OTS | 155 |
| 9 | 50 | F9a | 145 |
| 10 | 65 | F9a | 134 |
| 11 | 80 | F9a | 124 |

The surface configurations and the kinds of organic molecules shown in Table 1 were selected, so that the contact angle of a water droplet relative to the wafer surface was controlled by about 10 degrees stepwise in the range from 174 degrees to 124 degrees. In the case where it is required to obtain a minute change in contact angle of a water droplet relative to the wafer surface, it is possible to conduct an experiment by selecting the surface configuration and the organic molecule accordingly.

Examples 12 through 17

Mono-molecular films were formed on respective silicon semiconductor wafers equivalent to those used in Examples 6 through 11, except that asperities were not formed on the base member by etching.

Substrates were produced by forming the organic molecular films on the respective silicon semiconductor wafers in a similar manner as Examples 6 through 11 except that the two kinds of organic molecules as shown in Table 2 were used as the organic molecules for composing each of the mono-molecular films. A contact angle of a water droplet relative to each of the substrate surfaces was measured. The results of measurements are shown in Table 2.

TABLE 2

| Example No. | Combination and mixing ratio of organic molecules (volume %) | | Contact angle of water droplet (degree) |
| --- | --- | --- | --- |
| 12 | F17a (80) | F9a (20) | 125 |
| 13 | F17a (85) | OTS (15) | 124 |
| 14 | F17a (75) | F3a (25) | 123 |
| 15 | F17a (70) | F3a (30) | 122 |
| 16 | F17a (75) | OTS (25) | 121 |
| 17 | F17a (60) | F3a (40) | 120 |

Examples 12 through 17 are examples in which the states of the silicon wafers were finely controlled g plural kinds of organic molecules. Specifically, the organic molecules were selected, so that the contact angle of a water droplet relative to the wafer surface was changed by 1 degree stepwise in the range from 120 degrees to 125 degrees. The experiment results reveal that the contact angle of a water droplet relative to the wafer surface is relatively freely controllable by selecting the combination and the mixing ratio of the organic molecules.

Further, the controllability of the contact angle can be improved by selecting the other organic molecules, and a mixing ratio of these ingredients.

Examples 18 through 21

Mono-molecular films were formed on silicon semiconductor wafers equivalent to those used in Examples 6 through 11, wherein asperities were formed by etching, so that the area ratio of protrusions relative to recesses was 50%. Two kinds of organic molecules as shown in Table 3 were used in a mixing ratio of 50:50 to form each of the mono-molecular films. Substrates were produced by forming the mono-molecular films on the respective silicon semiconductor wafers in the same manner as Examples 6 through 11 except for the aforementioned points. A contact angle of a water droplet relative to each of the wafer surfaces was measured. The results of measurement are as shown in Table 3.

TABLE 3

| Example No. | Combination and mixing ratio of organic molecules (volume %) | | Contact angle of water droplet (degree) |
|---|---|---|---|
| 18 | F17a (50) | OTS (50) | 145 |
| 19 | F17a (50) | F3a (50) | 149 |
| 20 | F17a (50) | F9a (50) | 152 |
| 21 | F9a (50) | F3a (50) | 142 |

Generally, it is conceived that crystal nuclei are desirably formed if a liquid to be crystallized exhibits a shape analogous to a true sphere. Further, it is conceived that atmospheric conditions surrounding the liquid such as temperature, humidity, and atmospheric gas may affect crystal nuclei formation.

In view of this, providing the aforementioned various surface treatment methods, namely, providing means for setting the contact angle of a water droplet or finely controlling the contact angle of a water droplet as proposed in the present invention is advantageous in selecting an optimal crystal nuclei formable state, which is useful in a so-called combinatorial chemistry technique.

As mentioned above, the inventive substrate is advantageous in minimizing the contact area of the liquid containing the material to be crystallized with the substrate surface because the organic molecular film showing non-affinity to the liquid is formed on the surface of the base member by covalent bonding. In other words, wettability of the substrate surface is suppressed by the organic molecular film having non-affinity to the liquid, and the contact angle of a droplet of the liquid to be crystallized with the substrate surface is significantly increased, whereby the contact area can be minimized.

Accordingly, generation of micro crystals or crystal polymorphs can be suppressed in the contact region of the liquid to be crystallized with the substrate surface. Further, unlike crystallization in a microgravity space, the present invention is advantageous in suppressing liquid surface oscillation which may occur between the liquid to be crystallized and a gas surrounding the substrate, and in eliminating a measure for keeping liquid droplets from floating in the air. Thus, the present invention makes it possible to obtain single crystals efficiently at a low cost.

The inventive substrate is applicable to the various well-known crystallization methods. Thereby, crystallization conditions can be improved, and more stable crystallization is executable. Thus, the inventive substrate is useful in various fields such as pharmaceutical/biochemical field, as well as catalyst development and material development. The inventive substrate is particularly useful in a so-called combinatorial chemistry according to which a multitude of conditions are simultaneously executable, because an optimal crystallization condition can be selected easily with use of the inventive substrate.

This application is based on Japanese Patent Application No. 2003-427888 filed on Dec. 24, 2003, and No. 2004-362765 filed on Dec. 15, 2004, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A substrate for use in crystallization comprising:
a base member having a surface; and
an organic molecular film on the surface of the base member,
the organic molecular film having a thickness of 0.5 to 100 nm,
the organic molecular film having non-affinity to a liquid to be crystallized, and
the organic molecular film being bound to the surface of the base member via a covalent bond,
wherein the surface of the substrate is formed with asperities having a plurality of protrusions with a height of 20 to 500 nm for supporting a droplet of the liquid, and a total area ratio at the uppermost level of the protrusions is 10 to 65% when the surface is observed from above; and
wherein the base member has at least one indented portion having a depth of 100,000 to 5,000,000 nm to keep a droplet of the liquid from rolling over the surface of the substrate.

2. The substrate according to claim 1, wherein the covalent bond between the organic molecular film and the surface of the base member is at least one bond selected from the group consisting of a siloxane bond (—SiO—) and a —SiN-bond.

3. The substrate according to claim 1, wherein the organic molecular film is formed by at least one organic molecule selected from the group consisting of organic molecules as represented by the following formulae (1), (2), (3), (4) and derivatives thereof:

$$F(CF_2)_m(CH_2)_n SiR_q X_{3-q} \quad (1);$$

$$F(CF_2)_r(CH_2)_s A(CH_2)_p SiR_q X_{3-q} \quad (2);$$

$$H(CH_2)_m(CH_2)_n SiR_q X_{3-q} \quad (3); \text{ and}$$

$$H(CH_2)_r(CH_2)_s A(CH_2)_p SiR_q X_{3-q} \quad (4)$$

where in the formulae (1) and (3), m is an integer from 1 to 15, n is an integer from 0 to 15, "m+n" is an integer from 5 to 30, q is an integer from 0 to 2, X is a halogen, an alkoxy, or an isocyanate, and R is a hydrogen or a hydrocarbon; and in the formulae (2) and (4), r is an integer from 1 to 8, s is an integer from 0 to 2, p is an integer from 5 to 25, q is an integer from 0 to 2, "r+s" is an integer from 1 to 10, A is an oxygen atom (—O—), an oxycarbonyl group (—COO—), or a dimethylsilyl group (—Si(CH$_3$)$_2$—), X is a halogen, an alkoxy, or an isocyanate, and R is a hydrogen or a hydrocarbon.

4. The substrate according to claim 3, wherein the organic molecule is at least one selected from the group consisting of organic molecules as represented by the following formulae (11) through (44):

$$CF_3(CF_2)_7(CH_2)_2SiCl_3 \quad (11)$$

$$F(CF_2)_4(CH_2)_2O(CH_2)_{15}SiCl_3 \quad (12)$$

$$CF_3COO(CH_2)_{15}SiCl_3 \quad (13)$$

$$F(CF_2)_4(CH_2)_2Si(CH_3)_2(CH_2)_9SiCl_3 \quad (14)$$

$$F(CF_2)_8Si(CH_3)_2(CH_2)_9SiCl_3 \quad (15)$$

$$CF_3(CH_2)_2Si(CH_3)_2(CH_2)_{15}SiCl_3 \quad (16)$$

$$CF_3CH_2O(CH_2)_{15}SiCl_3 \quad (17)$$

$$CH_3(CH_2)_7(CH_2)_2SiCl_3 \quad (18)$$

$$H(CH_2)_4(CH_2)_2O(CH_2)_{15}SiCl_3 \quad (19)$$

$$CH_3COO(CH_2)_{15}SiCl_3 \quad (20)$$

$$H(CH_2)_4(CH_2)_2Si(CH_3)_2(CH_2)_9SiCl_3 \quad (21)$$

$$H(CH_2)_8Si(CH_3)_2(CH_2)_9SiCl_3 \quad (22)$$

$$CH_3(CH_2)_2Si(CH_3)_2(CH_2)_{15}SiCl_3 \quad (23)$$

$$CH_3CH_2O(CH_2)_{15}SiCl_3 \quad (24)$$

$$CH_3(CH_2)_{17}SiCl_3 \quad (25)$$

$$CH_3(CH_2)_{18}SiCl_3 \quad (26)$$

$$CF_3(CH_2)_9SiCl_3 \quad (27)$$

$$CH_3(CH_2)_9SiBr_3 \quad (28)$$

$$CF_3(CH_2)_6SiBr_3 \quad (29)$$

$$CH_3(CH_2)_9SiH_2Cl \quad (30)$$

$$CH_3(CH_2)_9Si(CH_3)_2(OCH_3) \quad (31)$$

$$CF_2H(CF_2)_2(CH_2)_2SiH_2Cl \quad (32)$$

$$CF_3(CH_2)_2(CH_3)_2Si(CH_2)_{15}SiCl_3 \quad (33)$$

$$CF_3(CF_2)_3(CH_2)_2(CH_3)_2Si(CH_2)_9SiCl_3 \quad (34)$$

$$CF_3(CF_2)_7(CH_2)_2(CH_3)_2Si(CH_2)_9SiCl_3 \quad (35)$$

$$CF_3(CF_2)_7Si(CH_3)_2(CH_2)_9SiCl_3 \quad (36)$$

$$CF_3(CF_2)_6Si(CH_3)_2(OCH_3) \quad (37)$$

$$CF_3(CF_2)_6SiCl_3 \quad (38)$$

$$CF_3(CF_2)_7(CH_2)_2Si(OCH_3)_3 \quad (39)$$

$$CF_3(CF_2)_7(CH_2)_2SiBr_3 \quad (40)$$

$$CF_3(CF_2)_7(CH_2)_2Si(NCO)_3 \quad (41)$$

$$CF_3(CF_2)_6SiH_2Cl \quad (42)$$

$$CF_3(CF_2)_7(CH_2)_2SiH_2Cl \quad (43)$$

$$CF_3(CF_2)_7(CH_2)_2Si(CH_3)_2(OCH_3) \quad (44).$$

5. The substrate according to claim 1, wherein the asperities are formed on the surface of the substrate by forming the asperities on the surface of the base member according to a semiconductor photolithography.

6. The substrate according to claim 1, wherein the base member is made of at least one selected from the group consisting of glass, silicon, mica, a metal, and a resin.

7. The substrate according to claim 1, wherein a contact angle of a water droplet relative to the surface of the substrate is not less than 120 degrees but less than 180 degrees.

8. A method for producing a substrate formed with an organic molecular film having non-affinity to a liquid to be crystallized on a surface of a base member, the method comprising a step of:
contacting the surface of the base member having or introducing an active hydrogen atom, with an organic molecule having a terminal-bonding functional group capable of covalently bonding to the surface of the base member at one end thereof and a functional group showing non-affinity to the liquid at the other end thereof forming a bond between the terminal-bonding functional group of the organic molecule and the active hydrogen atom on the surface of the base member by reaction of the terminal-bonding functional group with the active hydrogen atom;
wherein the base member has asperities having a plurality of protrusions with a height of 20 to 500 nm for supporting a droplet of the liquid and having a total area ratio at the uppermost level of the protrusions of 10 to 65% when the surface is observed from above; and
the base member has at least one indented portion having a depth of 100,000 to 5,000,000 nm to keep a droplet of the liquid from rolling over the surface.

9. The method according to claim 8, wherein the organic molecular film is a mono-molecular film, a layered-molecular film, or an adjoining-molecule-bonding film.

10. The method according to claim 8, wherein a surface of the substrate has asperities formed by the asperities on the surface of the base member according to a semiconductor photolithography.

11. The method according to claim 9, wherein the mono-molecular film or the layered-molecular film is formed on the surface of the base member by contacting the surface of the base member with the organic molecule under a condition that the content of moisture vapor in an atmosphere is less than 6.80 g/m$^3$.

12. The method according to claim 9, wherein the adjoining-molecule-bonding film is formed on the surface of the base member by contacting the surface of the base member with the organic molecule under a condition that the content of moisture vapor in an atmosphere is not smaller than 6.80 g/m$^3$.

13. The method according to claim 8, wherein the organic molecular film is formed by chemical adsorption.

14. The method according to claim 8, wherein the terminal-bonding functional group of the organic molecule includes a halogenated silyl group, an alkyoxysilyl group, or an isocyanate silyl group, and the reaction of the terminal-bonding functional group with the active hydrogen atom on the surface of the base member is dehydrohalogenation, dealcoholation, or deisocyanation.

15. The method according to claim 8, wherein the covalent bond formed by the reaction of the terminal-bonding functional group with the active hydrogen atom on the surface of the base member is a siloxane bond (—SiO—) or a —SiN— bond.

16. The method according to claim 8, wherein the organic molecule is at least one selected from the group consisting of organic molecules as represented by the formulae (1), (2), (3), (4) and derivatives thereof:

$$F(CF2)_m(CH_2)_n SiR_q X_{3-q} \quad (1);$$

$$F(CF_2)_r(CH_2)_s A(CH_2)_p SiR_q X_{3-q} \quad (2);$$

$$H(CH_2)_m(CH_2)_n SiR_q X_{3-q} \quad (3); \text{ and}$$

$$H(CH_2)_r(CH_2)_s A(CH_2)_p SiR_q X_{3-q} \quad (4)$$

where in the formulae (1) and (3), m is an integer from 1 to 15, n is an integer from 0 to 15, "m+n" is an integer from 5 to 30, q is an integer from 0 to 2, X is a halogen, an alkoxy, or an isocyanate, and R is a hydrogen or a hydrocarbon; and in the formulae (2) and (4), r is an integer from 1 to 8, s is an integer from 0 to 2, p is an integer from 5 to 25, q is an integer from 0 to 2, "r+s" is an integer from 1 to 10, A is an oxygen atom (—O—), an oxycarbonyl group (—COO—), or a dimethylsilyl group (—Si(CH$_3$)$_2$—), X is a halogen, an alkoxy, or an isocyanate, and R is a hydrogen or a hydrocarbon.

17. The method according to claim 8, wherein the organic molecule is at least one selected from the group consisting of organic molecules as represented by the formulae (11) through (44):

$$CF_3(CF_2)_7(CH_2)_2 SiCl_3 \quad (11)$$

$$F(CF_2)_4(CH_2)_2 O(CH_2)_{15} SiCl_3 \quad (12)$$

$$CF_3 COO(CH_2)_{15} SiCl_3 \quad (13)$$

$$F(CF_2)_4(CH_2)_2 Si(CH_3)_2(CH_2)_9 SiCl_3 \quad (14)$$

$$F(CF_2)_8 Si(CH_3)_2(CH_2)_9 SiCl_3 \quad (15)$$

$$CF_3(CH_2)_2 Si(CH_3)_2(CH_2)_{15} SiCl_3 \quad (16)$$

$$CF_3 CH_2 O(CH_2)_{15} SiCl_3 \quad (17)$$

$$CH_3(CH_2)_7(CH_2)_2 SiCl_3 \quad (18)$$

$$H(CH_2)_4(CH_2)_2 O(CH_2)_{15} SiCl_3 \quad (19)$$

$$CH_3 COO(CH_2)_{15} SiCl_3 \quad (20)$$

$$H(CH_2)_4(CH_2)_2 Si(CH_3)_2(CH_2)_9 SiCl_3 \quad (21)$$

$$H(CH_2)_8 Si(CH_3)_2(CH_2)_9 SiCl_3 \quad (22)$$

$$CH_3(CH_2)_2 Si(CH_3)_2(CH_2)_{15} SiCl_3 \quad (23)$$

$$CH_3 CH_2 O(CH_2)_{15} SiCl_3 \quad (24)$$

$$CH_3(CH_2)_{17} SiCl_3 \quad (25)$$

$$CH_3(CH_2)_{18} SiCl_3 \quad (26)$$

$$CF_3(CH_2)_9 SiCl_3 \quad (27)$$

$$CH_3(CH_2)_9 SiBr_3 \quad (28)$$

$$CF_3(CH_2)_6 SiBr_3 \quad (29)$$

$$CH_3(CH_2)_9 SiH_2 Cl \quad (30)$$

$$CH_3(CH_2)_9 Si(CH_3)_2(OCH_3) \quad (31)$$

$$CF_2 H(CF_2)_2(CH_2)_2 SiH_2 Cl \quad (32)$$

$$CF_3(CH_2)_2(CH_3)_2 Si(CH_2)_{15} SiCl_3 \quad (33)$$

$$CF_3(CF_2)_3(CH_2)_2(CH_3)_2 Si(CH_2)_9 SiCl_3 \quad (34)$$

$$CF_3(CF_2)_7(CH_2)_2(CH_3)_2 Si(CH_2)_9 SiCl_3 \quad (35)$$

$$CF_3(CF_2)_7 Si(CH_3)_2(CH_2)_9 SiCl_3 \quad (36)$$

$$CF_3(CF_2)_6 Si(CH_3)_2(OCH_3) \quad (37)$$

$$CF_3(CF_2)_6 SiCl_3 \quad (38)$$

$$CF_3(CF_2)_7(CH_2)_2 Si(OCH_3)_3 \quad (39)$$

$$CF_3(CF_2)_7(CH_2)_2 SiBr_3 \quad (40)$$

$$CF_3(CF_2)_7(CH_2)_2 Si(NCO)_3 \quad (41)$$

$$CF_3(CF_2)_6 SiH_2 Cl \quad (42)$$

$$CF_3(CF_2)_7(CH_2)_2 SiH_2 Cl \quad (43)$$

$$CF_3(CF_2)_7(CH_2)_2 Si(CH_3)_2(OCH_3) \quad (44).$$

18. The substrate according to claim 1, wherein the total area ratio at the uppermost level of the protrusions is 10 to 30%.

19. The substrate according to claim 1, wherein the organic molecular film is a monomolecular film having a thickness of 0.5 to 2 nm.

20. The substrate according to claim 1, wherein the organic molecular film is a layered monomolecular film having a thickness of 1 to 10 nm.

* * * * *